(12) United States Patent
Kim et al.

(10) Patent No.: US 8,848,465 B2
(45) Date of Patent: Sep. 30, 2014

(54) MEMORY DEVICES INCLUDING SELECTIVE RWW AND RMW DECODING

(75) Inventors: Seo-Hee Kim, Hwaseong-si (KR);
Seong-Hyun Jeon, Hwaseong-si (KR);
Hoi-Ju Chung, Yongin-si (KR);
Sung-Hoon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 298 days.

(21) Appl. No.: 13/532,911

(22) Filed: Jun. 26, 2012

(65) Prior Publication Data
US 2013/0010550 A1 Jan. 10, 2013

(30) Foreign Application Priority Data

Jul. 6, 2011 (KR) ........................ 10-2011-0066934
Jul. 15, 2011 (KR) ........................ 10-2011-0070464
Jul. 28, 2011 (KR) ........................ 10-2011-0075366
Jul. 28, 2011 (KR) ........................ 10-2011-0075367

(51) Int. Cl.
*G11C 7/00* (2006.01)
*G11C 7/10* (2006.01)
*G11C 7/02* (2006.01)

(52) U.S. Cl.
CPC ............... *G11C 7/02* (2013.01); *G11C 7/1006* (2013.01)
USPC ..................................... 365/189.15; 365/220

(58) Field of Classification Search
CPC .......................... G11C 11/4091; G11C 11/419
USPC .............................................. 365/189.15, 220
See application file for complete search history.

(56) References Cited

U.S. PATENT DOCUMENTS 6,510,537 B1 * 1/2003 Lee ................................ 714/763

FOREIGN PATENT DOCUMENTS

| JP | 56-022292 | 3/1981 |
| JP | 09-246997 | 9/1997 |
| JP | 2001-274693 | 5/2001 |
| JP | 2006-260139 | 9/2006 |

* cited by examiner

*Primary Examiner* — Son Dinh
*Assistant Examiner* — Nam Nguyen
(74) *Attorney, Agent, or Firm* — Myers Bigel Sibley & Sajovec, P.A.

(57) ABSTRACT

A nonvolatile memory device is provided, which includes a memory core including a plurality of nonvolatile memory cells, a first read circuit that reads a first codeword from the memory core during a Read While Write (RWW) operation, a second read circuit that reads a second codeword from the memory core during a Read Modification Write (RMW) operation, and a common decoder that is shared by the first read circuit and the second read circuit and selectively decodes the first codeword or the second codeword.

20 Claims, 25 Drawing Sheets if B>C

WR_DATA 2    0 1 0   ...   0 0 0

DCWIF 1    0 if B<C

WR_DATA 2    1 0 1   ...   1 1 1

DCWIF 1    1

MEMORY DEVICES INCLUDING SELECTIVE RWW AND RMW DECODING

CROSS-REFERENCE TO RELATED APPLICATIONS

This application claims priority from Korean Patent Application No. 10-2011-0066934, filed on Jul. 6, 2011, Korean Patent Application No. 10-2011-0070464, filed on Jul. 15, 2011, Korean Patent Application No. 10-2011-0075367, filed on Jul. 28, 2011, and Korean Patent Application No. 10-2011-0075366, filed Jul. 28, 2011, in the Korean Intellectual Property Office, and all the benefits accruing therefrom under 35 U.S.C. 119. The disclosures of all of the above referenced applications are hereby incorporated herein in their entireties by reference.

BACKGROUND

1. Field of Inventive concepts

Present Inventive concepts relate to nonvolatile memory devices.

2. Description of Related Art

Nonvolatile memory devices using resistance materials include Phase Change Random Access Memories (PRAMs), Resistive RAMs (RRAMs), and Magnetic RAMs (MRAMs). Unlike Dynamic RAMs (DRAMs) or flash memories that store data as charge, nonvolatile memory devices using resistance materials use a phase-changeable material such as a chalcogenide alloy (RRAM), a variable resistance material (RRAM), and/or a Magnetic Tunnel Junction (MJT) thin films having a variable magnetization state (MRAM).

As one example of a nonvolatile memory device using a variable resistance material, the PRAM will be described in some additional detail. The phase-change material used in conventional PRAMs goes into a crystalline state or an amorphous state due to a change in temperature by cooling followed by heating. Since the resistance of a phase-change material in the more crystalline state is relatively low and the resistance of a more amorphous phase-change material is relatively high, the crystalline state is referred to as set data and the amorphous state is referred to as reset data.

Meanwhile, as the memory capacity of a nonvolatile memory device increases, it may be necessary to use an error correction circuit to correct an error of a failed memory cell. The error correction circuit may be based on, for example, a method using a redundancy memory cell and an ECC (Error Correction Code) method.

Here, the ECC method employs an ECC encoder and an ECC decoder, which may be relatively large in size. Therefore, it may be difficult to reduce a chip size of a nonvolatile memory device using the ECC method.

SUMMARY

Present Inventive concepts may provide a nonvolatile memory device which can minimize/reduce a chip size.

The above and other objects of present Inventive concepts will be described in or be apparent from the following description of embodiments.

According to an aspect of present Inventive concepts, there is provided a nonvolatile memory device including a memory core including a plurality of nonvolatile memory cells, a first read circuit that reads a first codeword from the memory core during a Read While Write (RWW) operation, a second read circuit that reads a second codeword from the memory core during a Read Modification Write (RMW) operation, and a common decoder that is shared by the first read circuit and the second read circuit and selectively decodes the first codeword or the second codeword.

According to another aspect of present Inventive concepts, there is provided a nonvolatile memory device including a memory core including a plurality of nonvolatile memory cells. A first read circuit reads a first codeword from the memory core during a Read While Write (RWW) operation, and a second read circuit reads a second codeword from the memory core during a Read Modification Write (RMW) operation. A first decoder is coupled to the first read circuit and decodes the first codeword, and a second decoder is coupled to the second read circuit and decodes the second codeword. Moreover, the first decoder and the second decoder do not perform a decoding operation simultaneously.

According to some other aspects of inventive concepts, a nonvolatile memory device may include a memory core including a plurality of nonvolatile memory cells. A first read circuit may be configured to read a first codeword from the memory core during a Read While Write (RWW) operation, and a second read circuit may be configured to read a second codeword from the memory core during a Read Modification Write (RMW) operation. In addition, a common decoder may be shared by the first read circuit and the second read circuit, and the common decoder may be configured to selectively decode the first codeword or the second codeword.

According to still other aspects of inventive concepts, a nonvolatile memory device may include a memory core including a plurality of nonvolatile memory cells. A first read circuit may be configured to read a first codeword from the memory core during a Read While Write (RWW) operation, and a second read circuit may be configured to read a second codeword from the memory core during a Read Modification Write (RMW) operation. A first decoder may be coupled to the first read circuit with the first decoder being configured to decode the first codeword, and a second decoder may be coupled to the second read circuit with the second decoder being configured to decode the second codeword. Moreover, the first decoder and the second decoder do not perform decoding operations simultaneously.

According to yet other aspects of inventive concepts, a nonvolatile memory device may include a memory core having a plurality of nonvolatile memory cells. A first read circuit may be coupled to the memory core with the first read circuit being configured to support Read While Write (RWW) operations by reading RWW codewords from the memory core. A second read circuit may be coupled to the memory core with the second read circuit being configured to support Read Modification Write (RMW) operations by reading RMW codewords from the memory core. In addition, a decoder may be coupled to the first and second read circuits with the decoder being configured to selectively decode RWW and RMW codewords so that RWW codewords and RMW code words are decoded at different times.

BRIEF DESCRIPTION OF THE DRAWINGS

The above and other features and advantages of present Inventive concepts will become more apparent by describing in detail embodiments thereof with reference to the attached drawings in which.

DETAILED DESCRIPTION OF EMBODIMENTS

Figure 1:
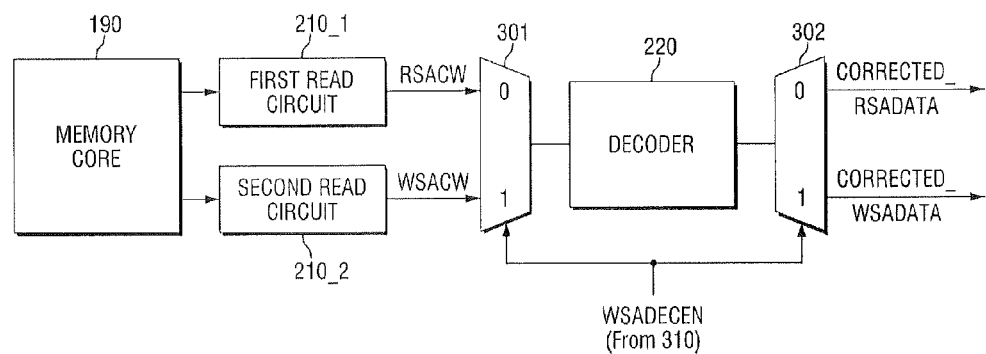
FIG. 1 is a block diagram of a nonvolatile memory device according to some embodiments of present Inventive concepts.

Advantages and features of present Inventive concepts and methods of accomplishing the same may be understood more readily by reference to the following detailed description of embodiments and the accompanying drawings. Present Inventive concepts may, however, be embodied in many different forms and should not be construed as being limited to embodiments set forth herein. Rather, these embodiments are provided so that this disclosure will be thorough and complete and will fully convey Inventive concepts to those skilled in the art, and present Inventive concepts will only be defined by the appended claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of present Inventive concepts.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which Inventive concepts belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The following description is directed to embodiments of present Inventive concepts using phase change random access memory (PRAM) devices. However, it will be understood by those of ordinary skill in the art that present Inventive concepts can be applied to nonvolatile memory devices that use resistance materials, such as resistive random access memory (RRAM) devices, ferroelectric random access memory (FRAM) devices, and the like.

Figure 2:
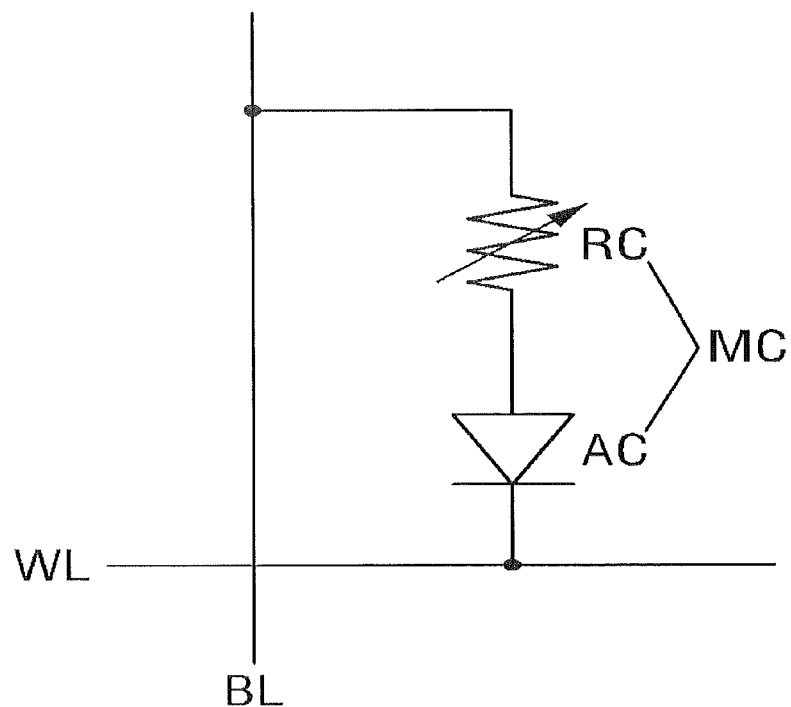
FIG. 2 illustrates an exemplary nonvolatile memory cell in a memory core shown in FIG. 1.

FIG. 1 is a block diagram of a nonvolatile memory device according to some embodiments of present Inventive concepts, and FIG. 2 illustrates an example of a nonvolatile memory cell in a memory core shown in FIG. 1.

Referring to FIG. 1, the nonvolatile memory device 1 according to some embodiments of present Inventive concepts includes a memory core 190, a first read circuit 210_1, a second read circuit 210_2, a common decoder 220, a first selector 301, and a second selector 302. With this configuration, the nonvolatile memory device 1 may perform an error correcting operation using an error correction code (ECC).

The memory core 190 may include a plurality of nonvolatile memory cells (MC of FIG. 2). The nonvolatile memory cell MC may write or read data using a resistive material. The nonvolatile memory cell MC may include a variable resistive element (RC) having a phase-change material having different resistance levels according to data stored, and an access element (AC) that controls the current flowing through the variable resistive element RC. Here, the access element AC may be a diode or a transistor coupled to the variable resistive element RC in series. In the drawing, the variable resistive element RC is a diode. In addition, the phase-change materials may include various kinds of materials, such as: binary atomic compounds (such as GaSb, InSb, InSe, $Sb_2Te_8$, or GeTe); ternary atomic compounds (such as GeSbTe, GaSeTe, InSbTe, $SnSb_2Te_4$, or InSbGe); and/or quaternary atomic compounds (such as AgInSbTe, (GeSn)SbTe, GeSb(SeTe), or $Te_{51}Ge_{15}Sb_2S_2$). For example, GeSbTe, which includes germanium (Ge), antimony (Sb), and tellurium (Te), may be generally used.

Although not shown in FIG. 1, an encoder (not shown) receives message data and generates a parity bit capable of correcting a bit error. A write circuit (not shown) writes message data and the parity bit on the memory core 190. Here, "message data+parity bit" may be referred to as a "codeword."

The first read circuit 210_1 reads a first codeword (RSACW) from the memory core 190 during a Read While Write (RWW) operation. The first read circuit 210_1 is used for a normal read operation.

Here, the RWW operation means that a read operation is performed while a write operation is performed. For example, the write operation may be performed at one region, while the read operation may be performed at another region. In the following description, a read command input during a RWW operation is referred to as a "RWW read command" and a read operation while the RWW operation is performed is referred to as "RWW read." The RWW read command is the same as a normal read command, except that it is input while the write operation is performed.

The second read circuit 210_2 reads a second codeword (WSACW) from the memory core 190 during a Read Modification Write (RMW) operation.

In the RMW operation, the data stored in the memory core 190 is read, the read data is compared with data to be written, and only different bits are written. That is to say, in the RMW operation, the read operation should be selected prior to the write operation. In the following description, the read command input during the RMW operation is referred to as a "RMW read command" and the read operation performed while the RMW operation is performed is referred to as "RMW read."

The common decoder 220 is shared by the first read circuit 210_1 and the second read circuit 210_2. The common decoder 220 selectively decodes the first codeword RSACW supplied from the first read circuit 210_1 or the second codeword WSACW supplied from the second read circuit 210_2. The common decoder 220 decodes the first codeword RSACW and the second codeword WSACW to obtain an error position of message data. Thereafter, the common decoder may correct the message data and may output corrected message data CORRECTED_RSADATA or CORRECTED_WSADATA.

In addition, the first selector 301 and the second selector 302 operate in response to a selection signal (WSADECEN). When the selection signal WSADECEN is in a first level (e.g., logic "0"), the first and second selectors 301 and 302 couple the first read circuit 210_1 to the common decoder 220. In addition, when the selection signal WSADECEN is in a second level (e.g., logic "1"), the first and second selectors 301 and 302 couple the second read circuit 210_2 to the common decoder 220. Here, the selection signal WSADECEN is supplied from the signal generator 310. Configuration and operation of the signal generator 310 will later be described in detail.

Alternatively, although not shown, according to the selection signal WSADECEN, the first read circuit 210_1 may perform a sensing operation or the second read circuit 210_2 may perform a sensing operation. That is to say, the sensing operation of the first read circuit 210_1 and the sensing operation of the second read circuit 210_2 may not be simultaneously performed. The sensing operation will later be described in detail with reference to FIG. 7.

The nonvolatile memory device 1 according to some embodiments of present Inventive concepts employs the common decoder 220. That is to say, a decoder used for a normal read operation (or an RWW read operation) and a decoder used for an RMW read operation are not separately provided. When a decoder used for a normal read operation and a decoder used for an RMW read operation simultaneously operate, noise may be generated between the decoders. Here, the nonvolatile memory device 1 according to some embodiments of present Inventive concepts employs the common decoder 220, and the first codeword and the second codeword are not decoded simultaneously. Therefore, generation of noise may be reduced and/or eliminated. In addition, since two decoders are combined into one common decoder, a chip size can be reduced and/or minimized.

Figure 3:
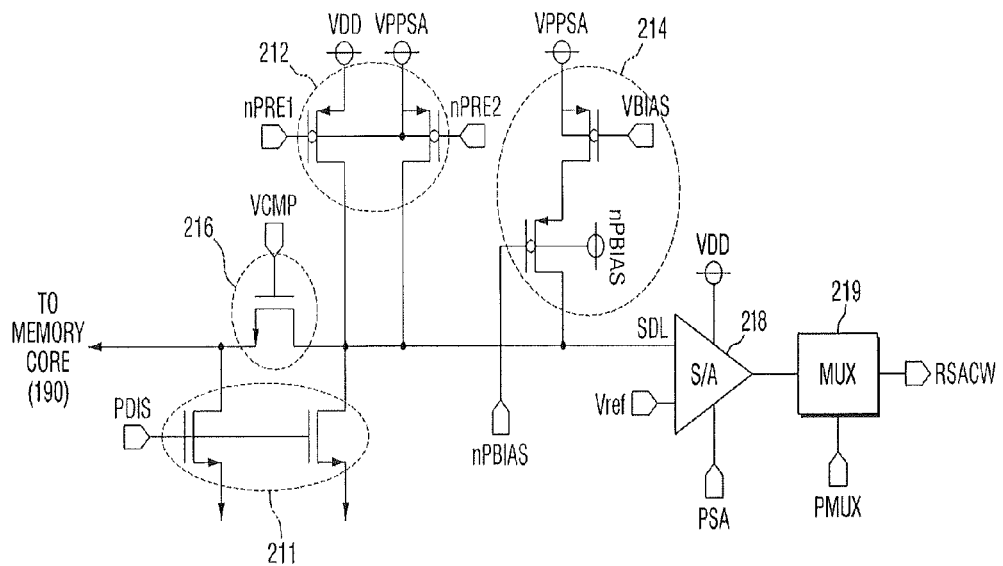
FIG. 3 is a circuit diagram of a read circuit shown in FIG. 1.

FIG. 3 is a circuit diagram of a read circuit shown in FIG. 1.

Since the first read circuit 210_1 and the second read circuit 210_2 shown in FIG. 1 have substantially the same circuit configurations, the following description will be made with reference to only the first read circuit 210_1. The circuit diagram of FIG. 3 is provided only for illustration, but aspects of present Inventive concepts are not limited thereto.

Referring to FIG. 3, the first read circuit 210_1 may include a discharge unit 211, a pre-charge unit 212, a compensation unit 214, a clamping unit 216, a sense amp 218, and a MUX (multiplexer) 219.

The pre-charge unit 212 pre-charges a sensing node (SDL) to a constant level voltage, for example, a power supply voltage (VDD) or a boost voltage (VPPSA) during a pre-charge period, prior to a sensing operation. The pre-charge unit 212 may include a PMOS transistor controlled by a pre-charge control signal (nPRE1 or nPRE2).

The compensation unit 214 supplies compensation current to the sensing node SDL to compensate for a level reduction of the sensing node SDL generated by the shot-through current (Icell) flowing through a selected nonvolatile memory cell (MC of FIG. 2).

In detail, when the nonvolatile memory cell is in a set state, since the resistance of a phase change material is relatively low, an amount of the shot-through current Icell is relatively high. When the nonvolatile memory cell is in a reset state, since the resistance of a phase change material is relatively high, an amount of the shot-through current Icell is relatively low. Here, an amount of the compensation current supplied from the compensation unit 214 may be enough to compensate for the shot-through current Icell in the reset state. In such a manner, the sensing node SDL in the reset state is maintained at a constant level, while the node SDL in the set state is lowered. Therefore, since there is a significant level difference between the sensing node SDL in the reset state and the sensing node SDL in the set state, it may be relatively easy to differentiate the set state and the reset state, thereby increasing a sensing margin. The compensation unit 214 may include a PMOS transistor controlled by a compensation control signal (nPBIAS) and a PMOS transistor controlled by a voltage signal (VBIAS).

The clamping unit 216 clamps a level of a bit line BL coupled to a selected nonvolatile memory cell to be in an appropriate range for read operation. In detail, the clamping unit 216 clamps the bit line BL to a predetermined level not exceeding a threshold voltage (Vth). This is because a phase of a phase change material of the selected nonvolatile memory cell may be changed when the level of the bit line BL exceeds the threshold voltage Vth. The clamping unit 216 may include an NMOS transistor controlled by a clamping control signal (VCMP).

The discharge unit 211 discharges the sensing node SDL after the sensing operation. The discharge unit 211 may include an NMOS transistor controlled by a discharge control signal (PDIS).

The sense amp 218 compares the level of the sensing node SDL with a reference level (Vref) and outputs a comparison result. The sense amp 218 may be a current sense amp or a voltage sense amp. The sense amp 218 is enabled by a sense amp control signal (PSA).

The MUX 219 selectively outputs an output signal of the sense amp 218. The MUX 219 is enabled by a MUX control signal (PMUX).

Figure 4:
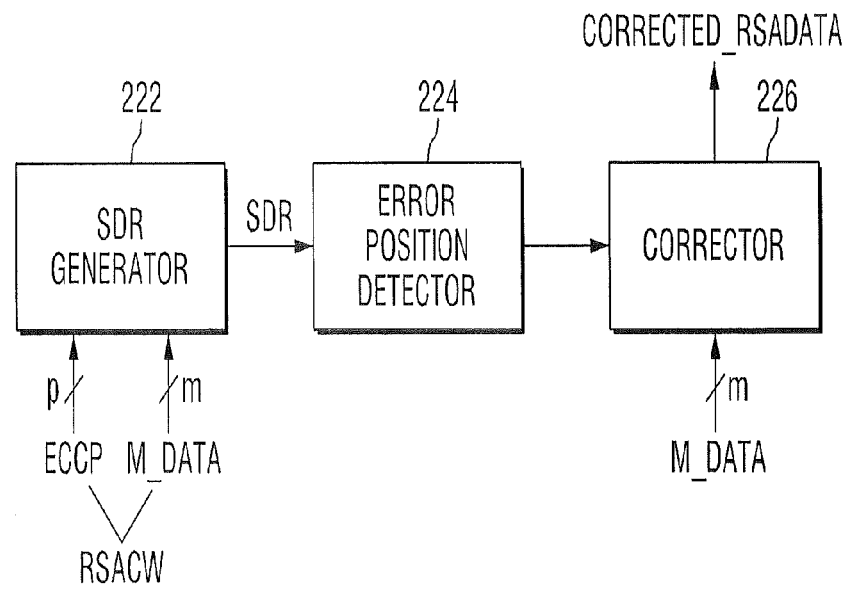
FIG. 4 is a block diagram of a common decoder shown in FIG. 1.

FIG. 4 is a block diagram of a common decoder shown in FIG. 1.

In FIG. 4, the common decoder 220 receives and decodes a first codeword (RSACW), for example.

Referring to FIG. 4, the common decoder 220 may include a syndrome generator 222, an error position detector 224, and an error corrector 226.

The syndrome generator 222 generates a syndrome (SDR) using message data (M_DATA) and a parity bit (ECCP) (that is, the first codeword RSACW). The error position detector 224 detects an error position of the message data M_DATA using the syndrome SDR. For example, the error position detector 224 calculates coefficients of an error position equation using two or more syndromes SDRs and detects the error position based on the coefficients. The error corrector 226 corrects an error of the message data M_DATA based on the detected error position. The corrected message data is denoted by CORRECTED_RSADATA.

Figure 5:
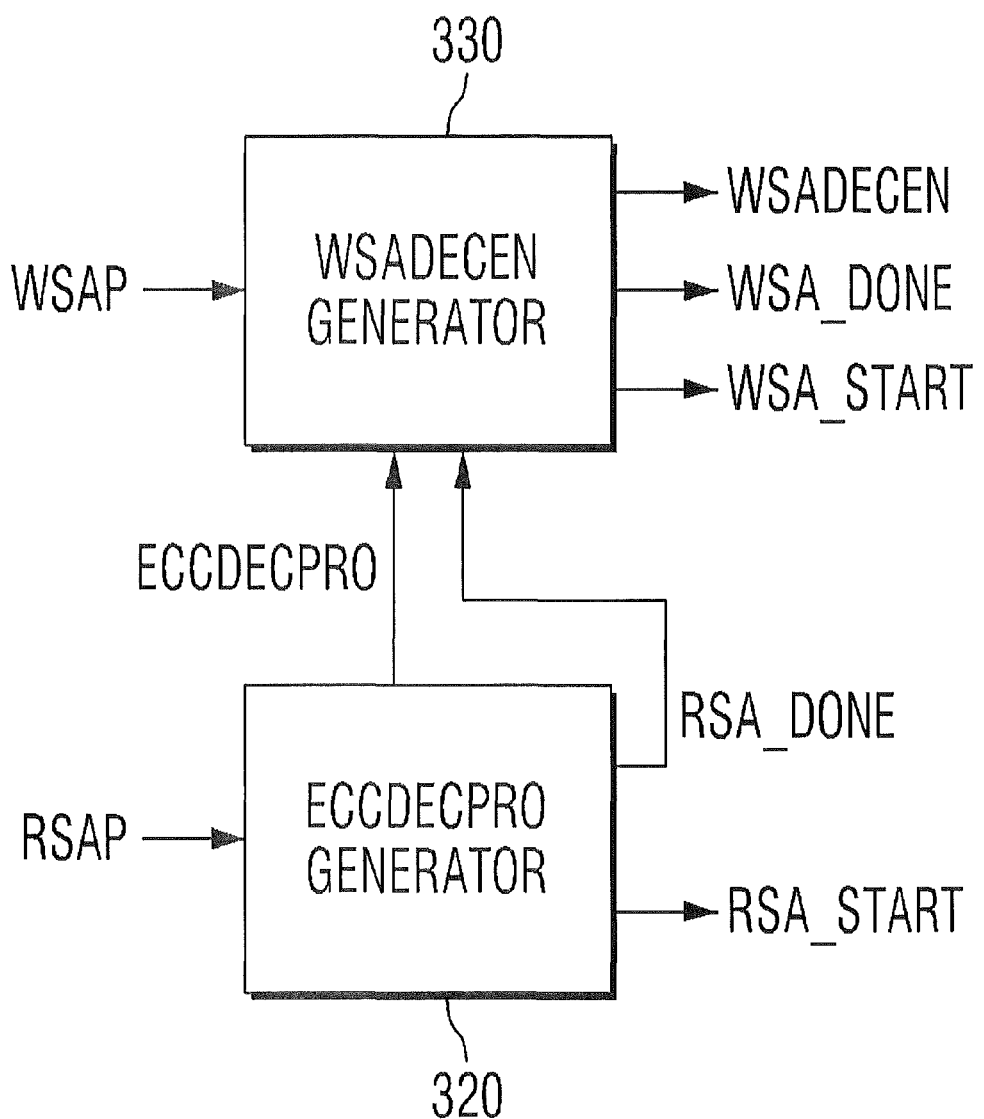
FIG. 5 is a block diagram of a signal generator shown in FIG. 1.

FIG. 5 is a block diagram of a signal generator shown in FIG. 1.

Referring to FIG. 5, the signal generator 310 includes a protection signal generator 320 and a selection signal generator 330.

In detail, the protection signal generator 320 receives a first pulse (RSAP) generated based on the RWW read command and generates a protection signal (ECCDECPRO) enabled to at least a part of a read period of the RWW operation. In addition, the protection signal generator 320 may generate a first sensing start signal (RSA_START) and a first sensing termination signal (RSA_DONE) indicating sensing start and termination points of the RWW operation.

The selection signal generator 330 receives a second pulse (WSAP) generated based on a RMW read command and may generate a selection signal (WSADECEN) based on whether the protection signal ECCDECPRO is enabled or not. In addition, the selection signal generator 330 may generate a second sensing start signal (WSA_START) and a second sensing termination signal (WSA_DONE) indicating sensing start and termination points of the RMW operation.

Figure 6:
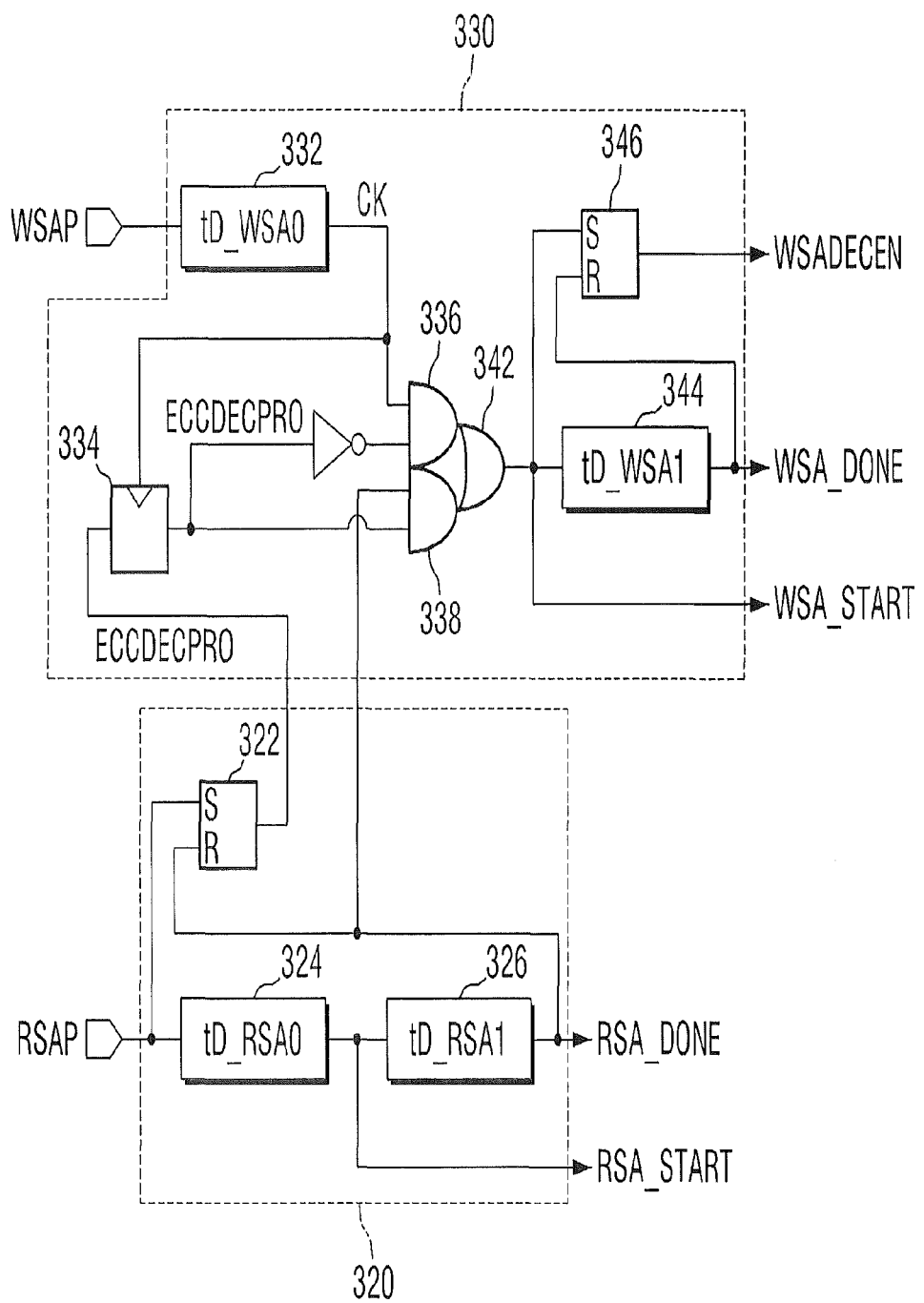
FIG. 6 is a detailed block diagram of the signal generator shown in FIG. 5.

FIG. 6 is a detailed block diagram of the signal generator shown in FIG. 5.

Referring to FIG. 6, the protection signal generator 320 may include first delays 324 and 326 and a first SR latch 322.

The first delays 324 and 326 may delay the first pulse RSAP to generate the first sensing start signal (RSA_START) and the first sensing termination signal (RSA_DONE).

The first SR latch 322 receives the first pulse RSAP and the first sensing termination signal RSA_DONE to generate the protection signal ECCDECPRO. When the first sensing termination signal RSA_DONE is logic "0," if the first pulse RSAP (that is, logic "1") is input, the protection signal ECCDECPRO is enabled to, for example, logic "1." In addition, if the first sensing termination signal RSA_DONE is changed from logic "0" to logic "1," the protection signal ECCDECPRO is disabled. Even if the second pulse WSAP is input to the selection signal generator 330, the selection signal generator 330 does not generate the selection signal WSADECEN immediately. The selection signal generator 330 checks the level of the protection signal ECCDECPRO and the level of the first sensing termination signal RSA_DONE and generates the selection signal WSADECEN according to the checking result.

The selection signal generator 330 may include a second delay 332, a D flip-flop 334, operation units 336, 338 and 342, a third delay 344, and a second SR latch 346.

The second delay 332 delays the second pulse WSAP to generate a check signal CK.

The D flip-flop 334 transfers the protection signal ECCDECPRO in response to the check signal CK.

The operation units 336, 338 and 342 receives the check signal CK, the transferred protection signal ECCDECPRO and the first sensing termination signal RSA_DONE. Here, the operation units 336, 338 and 342 include a first AND gate 336, a second AND gate 338 and an OR gate 342. The first AND gate 336 receives an inversion signal of the protection signal ECCDECPRO and the check signal CK. The second AND gate 338 receives the protection signal ECCDECPRO and the first sensing termination signal RSA_DONE. The OR gate 342 receives an output of the first AND gate 336 and an output of the second AND gate 338.

The third delay 344 delays outputs of the operation units 336, 338 and 342 to generate the second sensing termination signal WSA_DONE. The second SR latch 346 receives the outputs of the operation units 336, 338 and 342 and the second sensing termination signal WSA_DONE to generate the selection signal.

Here, the operation units 336, 338 and 342 operate as follows.

If the second pulse WSAP is input, the level of the protection signal ECCDECPRO or the level of the first sensing termination signal RSA_DONE is checked.

It is assumed that the protection signal ECCDECPRO is enabled (that is, logic "1") at a time when the second pulse WSAP is input.

Therefore, since the inversion of the protection signal ECCDECPRO becomes logic "0," the first AND gate 336 outputs data being logic "0." In addition, even if the protection signal ECCDECPRO is logic "1," since the first sensing termination signal RSA_DONE is logic "0," the second AND gate 338 outputs data being logic "0." Therefore, the OR gate 342 also outputs data being logic "0." Eventually, the selection signal WSADECEN is also logic "0." To sum up, when the protection signal ECCDECPRO is enabled, the selection signal WSADECEN becomes logic "0."

In addition, if the sensing operation is terminated while the RWW operation is performed, the first sensing termination signal RSA_DONE is enabled (that is, logic "1"). Accordingly, the second AND gate 338 outputs data being logic "1."

Therefore, the OR gate 342 also outputs data being logic "1." Eventually, the selection signal WSADECEN is also logic "1." To sum up, if the sensing operation is terminated while the RWW operation is performed, the selection signal WSADECEN becomes logic "1."

Figure 7:
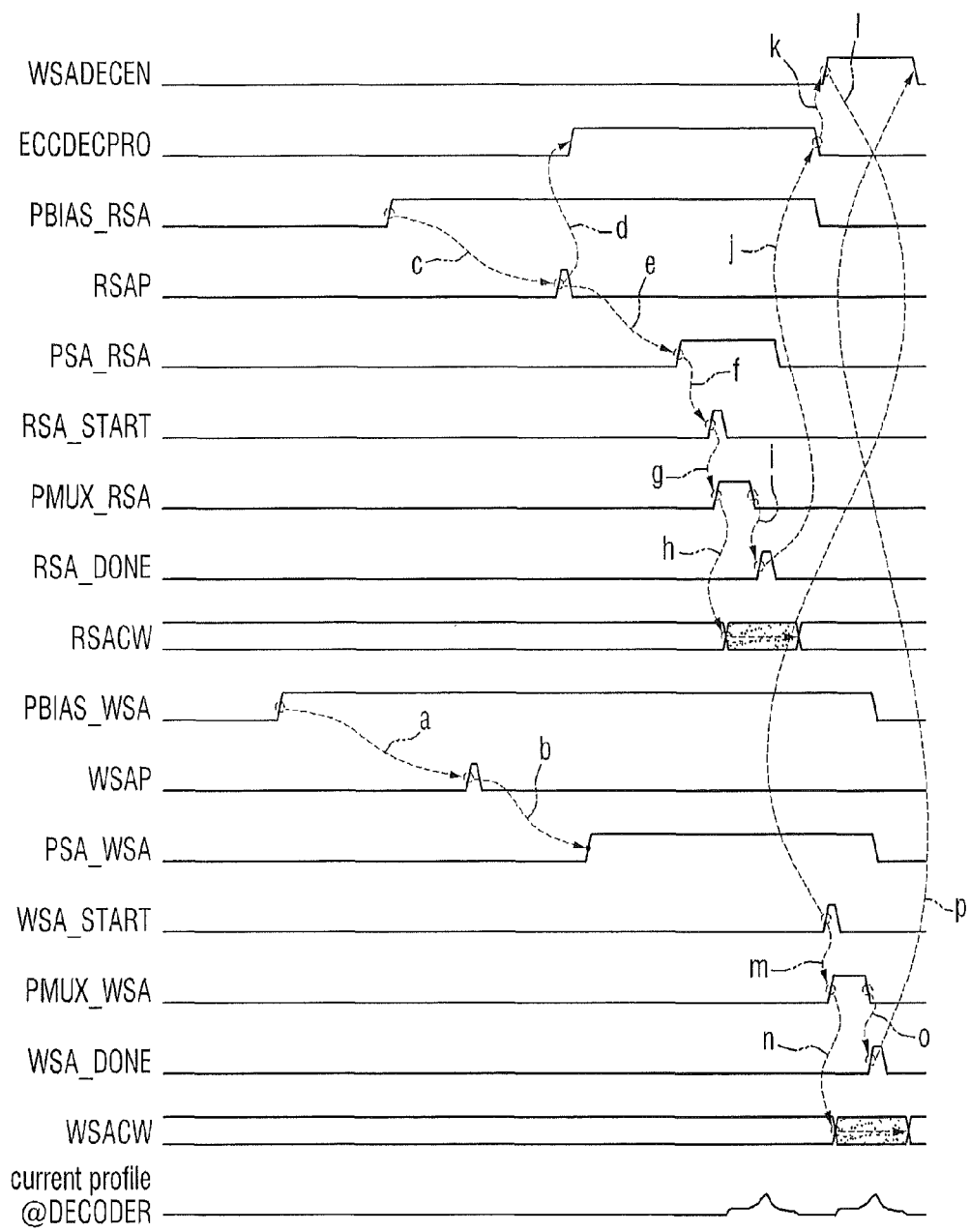
FIG. 7 is a timing diagram illustrating an operation of the signal generator shown in FIG. 6.

FIG. 7 is a timing diagram illustrating an operation of the signal generator shown in FIG. 6. The timing diagram of FIG. 7 is provided only for illustration, and aspects of present Inventive concepts are not limited thereto.

Referring to FIGS. 3, 6 and 7, a RMW read command is first input. Accordingly, a second compensation control signal (PBIAS_WSA) is enabled. In response to the second compensation control signal PBIAS_WSA, the second pulse WSAP is enabled (refer to symbol a). In response to the second pulse WSAP, the second sense amp control signal PSA_WSA is enabled (refer to symbol b).

Meanwhile, a RWW read command is input later than the RMW read command. Accordingly, the first compensation control signal PBIAS_RSA is enabled. In response to the first compensation control signal PBIAS_RSA, the first pulse RSAP is enabled (refer to symbol c). Here, in response to the first pulse RSAP, the protection signal ECCDECPRO is enabled (refer to symbol d). In response to the first pulse RSAP, the first sense amp control signal PSA_RSA is enabled (refer to symbol e).

In response to the first sense amp control signal PSA_RSA, the first sensing start signal RSA_START is enabled (refer to symbol f). In response to the first sensing start signal RSA_START, the first MUX control signal PMUX_RSA is enabled. Therefore, as the result of the sensing operation, the first codeword RSACW starts to be output (refer to symbol h). After a predetermined time is elapsed, the first MUX control signal PMUX_RSA is disabled. In response to the disabled first MUX control signal PMUX_RSA, the first sensing termination signal RSA_DONE is enabled (refer to symbol i).

As described above, in response to the first sensing termination signal RSA_DONE, the protection signal ECCDECPRO is disabled (refer to symbol j). If the protection signal ECCDECPRO is disabled from the enabled state (that is, in response to a falling edge of the protection signal ECCDECPRO), the selection signal WSADECEN is enabled (refer to symbol k).

If the selection signal WSADECEN is enabled, the second sensing start signal RSA_START is enabled (refer to symbol 1). In response to the second sensing start signal RSA_START, the second MUX control signal PMUX_WSA is enabled (refer to symbol m). Therefore, as the result of the sensing operation, the second codeword WSACW starts to be output (refer to symbol n). After a predetermined time is elapsed, the second MUX control signal PMUX_WSA is disabled. In response to the disabled second MUX control signal PMUX_WSA, the second sensing termination signal WSA_DONE is enabled (refer to symbol o). In response to the second sensing termination signal WSA_DONE, the selection signal WSADECEN is disabled.

To sum up, even if the RMW read command is first input and the RWW read command is then input, unless the second read circuit 210_2 starts the RMW read operation, the first read circuit 210_1 performs the RWW read operation first.

When the protection signal ECCDECPRO is in an enabled state, the second read circuit 210_2 may not perform the RMW read operation because when the second pulse WSAP based on the RMW read command is input to the signal generator 310, the selection signal WSADECEN is not enabled if the protection signal ECCDECPRO is in an enabled state.

After a predetermined time is elapsed, if the protection signal ECCDECPRO is disabled from the enabled state, the selection signal WSADECEN is enabled. Accordingly, the second read circuit 210_2 may perform the RMW read operation.

Figure 8:
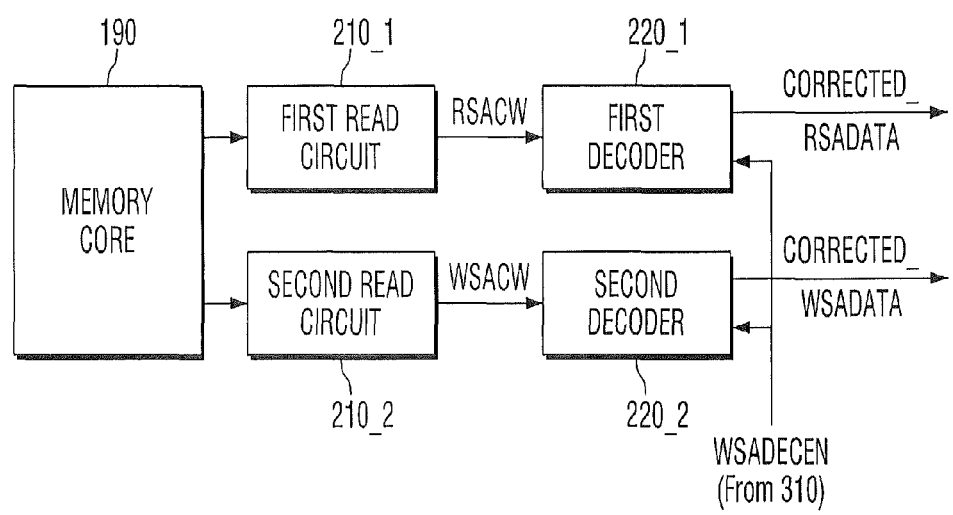
FIG. 8 is a block diagram of a nonvolatile memory device according to other embodiments of present Inventive concepts.

FIG. 8 is a block diagram of a nonvolatile memory device according to other embodiments of present Inventive concepts. For the sake of convenient explanation, the following description will focus on differences from the description of FIGS. 1 to 7.

Referring to FIG. 8, the nonvolatile memory device 2 does not include a common decoder (220 of FIG. 1). The nonvolatile memory device 2 includes a first decoder 220_1 that decodes a first codeword RSACW supplied from a first read circuit 210_1, and a second decoder 220_2 that decodes a second codeword WSACW supplied from a second read circuit 210_2. However, the first decoder 220_1 and the second decoder 220_2 receive a selection signal WSADECEN from a signal generator 310, and exclusively operate. That is to say, the first decoder 220_1 and the second decoder 220_2 do not perform decoding operations simultaneously. For example, when the selection signal WSADECEN is at a first level (for example, logic "0"), the first decoder 220_1 may decode the first codeword RSACW while the second decoder is disabled. When the selection signal WSADECEN is in a second level (for example, logic "1"), the second decoder 220_2 may decode the second codeword WSACW while the first decoder is disabled.

As described above, the signal generator 310 may further generate a protection signal ECCDECPRO enabled to at least part of a read period of an RWW operation. The signal generator 310 may enable the selection signal WSADECEN based on whether the protection signal ECCDECPRO is enabled or not.

In addition, although not shown, when the protection signal ECCDECPRO is in an enabled state, even if the RMW read command is input, the second read circuit 210_2 does not perform the RMW read operation.

In addition, when the protection signal ECCDECPRO is in an enabled state, if the RMW read command is input, the second read circuit 210_2 may perform the RMW read operation after the protection signal ECCDECPRO is disabled.

Meanwhile, even if the nonvolatile memory device 2 employs the common decoder 220, the first decoder 220_1 used in a normal read operation (or an RWW read operation) and the second decoder 220_2 used in an RMW read operation do not operate simultaneously. Therefore, noise due to simultaneous operation of the two decoders 220_1 and 220_2 can be reduced/avoided.

Figure 9:
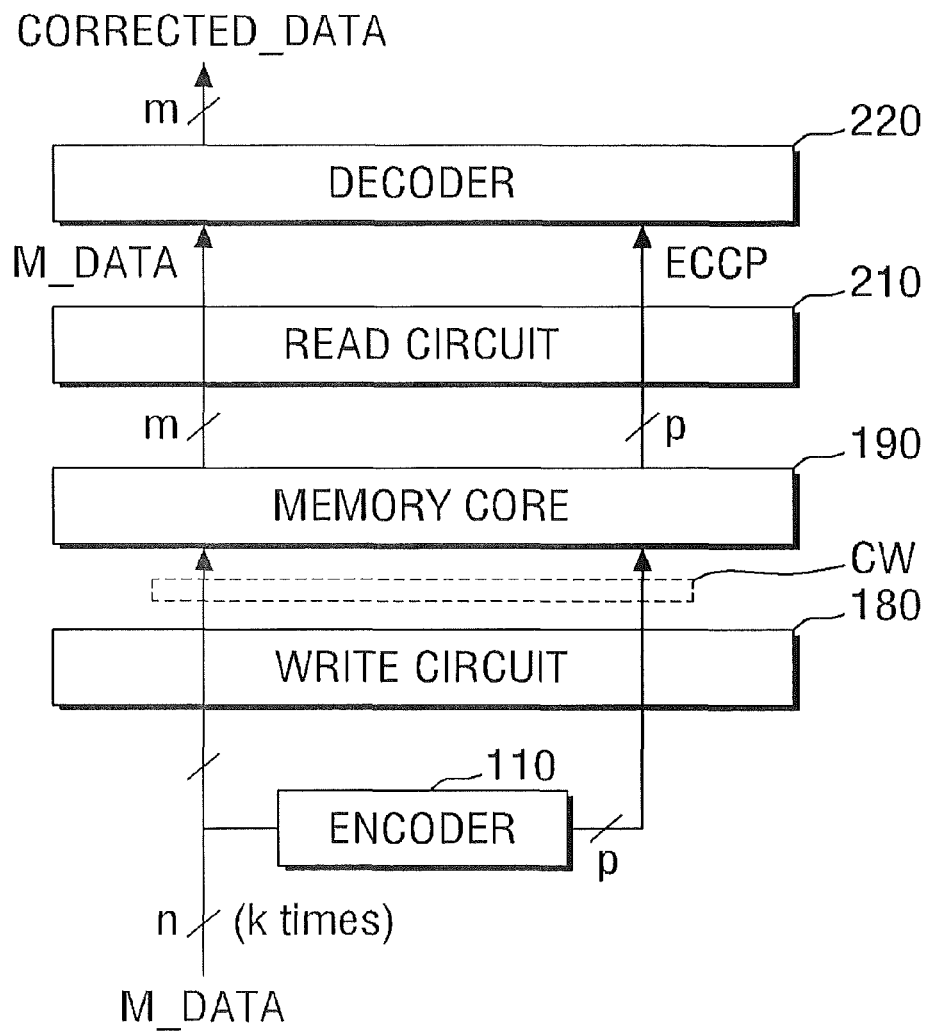
FIG. 9 is a block diagram of a nonvolatile memory device according to still other embodiments of present Inventive concepts.
Figure 10:
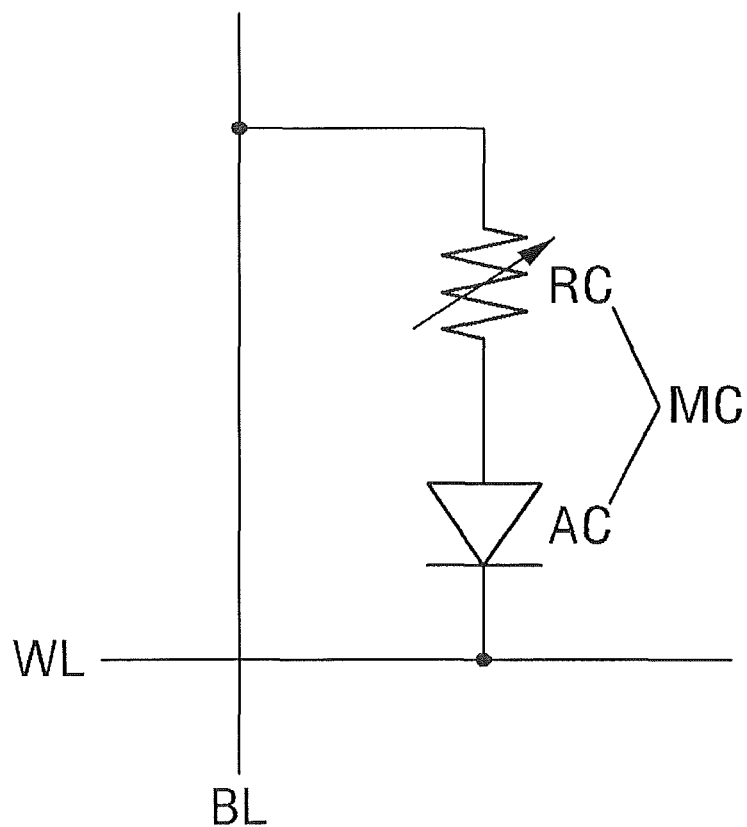
FIG. 10 illustrates an exemplary nonvolatile memory cell in a memory core shown in FIG. 9.

FIG. 9 is a block diagram of a nonvolatile memory device according to some embodiments of present Inventive concepts, and FIG. 10 illustrates an exemplary nonvolatile memory cell in a memory core shown in FIG. 9.

Referring to FIG. 9, the nonvolatile memory device 1 according to some embodiments of present Inventive concepts may include an encoder 110, a write circuit 180, a memory core 190, a read circuit 210, and a decoder 220. With this configuration, the nonvolatile memory device 1 of FIG. 9 may perform error correction using ECC.

The memory core 190 may include a plurality of nonvolatile memory cells (MC of FIG. 10). The nonvolatile memory cells MCs may store data using a resistance material. Each nonvolatile memory cell MC may include a variable resistive element (RC) having a phase-change material having different resistance levels according to data stored, and an access element (AC) that controls the current flowing through the variable resistive element RC. Here, the access element AC may be a diode or a transistor coupled to the variable resistive element RC in series. In the drawing, the variable resistive element RC is a diode. In addition, the phase-change materials may include various kinds of materials, such as binary atomic compounds (such as GaSb, InSb, InSe, $Sb_2Te_8$, or GeTe), ternary atomic compounds (such as GeSbTe, GaSeTe, InSbTe, $SnSb_2Te_4$, or InSbGe), and/or quaternary atomic compounds (such as AgInSbTe, (GeSn)SbTe, GeSb(SeTe), or $Te_{51}Ge_{15}Sb_2S_2$). For example, GeSbTe, which includes germanium (Ge), antimony (Sb), and tellurium (Te), may be generally used.

The encoder 110 receives message data M_DATA and generates a parity bit ECCP capable of correcting a bit error.

The write circuit 180 writes message data M_DATA and parity bit ECCP on the memory core 190. Here, "message data M_DATA+parity bit ECCP" may be referred to as a "codeword (CW)."

The read circuit 210 reads the message data M_DATA and the parity bit ECCP stored in the memory core 190.

The decoder 220 receives the message data M_DATA and the parity bit ECCP from the read circuit 210 and obtains the error position of the message data MDATA. Thereafter, the decoder 220 may correct the message data M_DATA to then output corrected message data CORRECTED_DATA.

In the nonvolatile memory device 1 of FIG. 9, the number of message data bits M_DATA input to the encoder 110 in parallel may be different from the number of message data bits M_DATA input to the decoder 220 in parallel. In other words, the message data bits M_DATA input to the encoder 110 in parallel may include n bits (Here, n is a natural number greater than 1), the message data bits M_DATA input to the decoder 220 in parallel may include m bits (here, m is a natural number greater than 1). For example, the number of message data bits M_DATA input to the encoder 110 in parallel may be less than the number of message data bits M_DATA input to the decoder 220 in parallel (e.g., due to the parity bit added by the encoder).

The encoder 110 receives message data M_DATA k times (Here, k is a natural number greater than 1) by n bits and performs ECC encoding whenever the message data M_DATA is received by n bits, thereby generating the parity bit ECCP. Consequently, the encoder 110 receives n×k bits to complete the parity bit ECCP. However, the encoder 110 generates parity bit ECCP by repeatedly performing "receiving message data M_DATA by n bits and ECC encoding" k times, rather than by simultaneously encoding n×k bits.

In addition, the decoder 220 decodes m-bit message data M_DATA simultaneously. Here, m is k times of n (Here, k is a natural number greater than 1).

Consequently, the decoder 220 obtains the error position of the message data M_DATA using m-bit message data M_DATA, and the encoder 110 generates the parity bit ECCP using m(=n×k) bit-message data M_DATA.

However, the encoder 110 and the decoder 220 are configured asymmetrically. That is to say, the encoder 110 is not configured to simultaneously encode (n×k)-bit message data M_DATA but is configured to simultaneously encode n-bit message data M_DATA. The encoder 110 simultaneously encodes a very small number of message data M_DATA. Therefore, the size of the encoder 110 used in the nonvolatile memory device 1 of FIG. 9 may be considerably reduced. The asymmetrically configuring of the encoder 110 and the decoder 220 may have a size reducing effect of approximately 88%, compared to a case of symmetrically configuring the encoder 110 and the decoder 220.

ECC encoding operations will later be described in detail with reference to FIGS. 11 to 13, and the ECC decoding operations will later be described in detail with reference to FIG. 14.

Meanwhile, as described above, in a case of a nonvolatile memory cell using a resistance material (for example, a phase change memory cell), a write operation may be much slower than a read operation. In addition, a read current level for the read operation may be much higher than a write current level for the write operation. Therefore, due to current capacity, the number of nonvolatile memory cells MCs capable of simultaneously performing read operations may be greater than the number of nonvolatile memory cells MCs capable of simultaneously performing write operations. For example, the write circuit 180, including 32 write drivers, may be capable of simultaneously performing write operations on 32 nonvolatile memory cells MC. The read circuit 210, including 256 sense amplifiers, may be capable of simultaneously performing read operations from 256 nonvolatile memory cells MC.

Therefore, in the nonvolatile memory device 1 of FIG. 9, the encoder 110 may simultaneously encode a relatively small number of message data M_DATA bits so as to correspond to the write circuit 180. In addition, the decoder 220 may simultaneously decode a relatively large number of message data M_DATA so as to correspond to the read circuit 210.

To sum up, the write circuit 180, including n write drivers (not shown), may simultaneously write n-bit message data M_DATA. The encoder 110 may receive each n bits of message data M_DATA in parallel and may simultaneously encode each n bits. In addition, the read circuit 210, including in sense amps (not shown), may simultaneously read m-bit message data M_DATA. The decoder 220 may receive each in bits of message data M_DATA in parallel and may simultaneously decode each m bits. Moreover, the m bits read/decoded in parallel by read circuit 210 and decoder 210 may be much greater than the n bits encoded/written by encoder 110 and write circuit 180.

The ECC encoding process of the encoder 110 will now be described in detail with reference to FIGS. 11 to 13.

Figure 11:
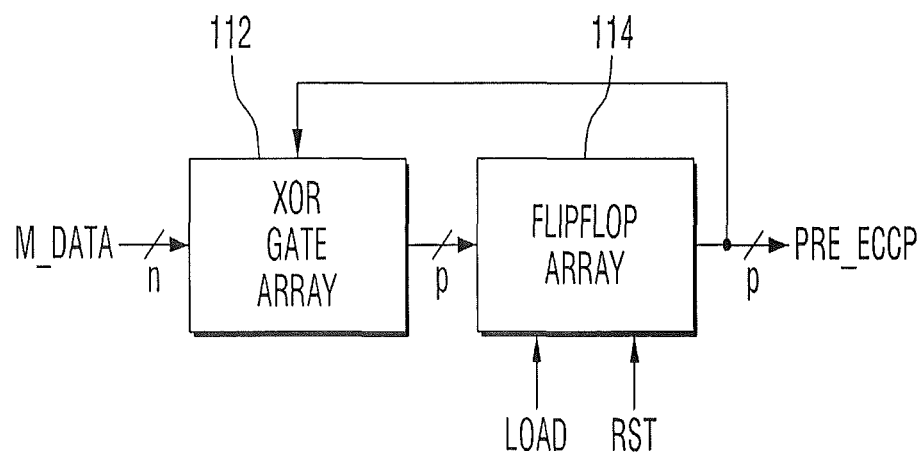
FIG. 11 is a block diagram of an encoder shown in FIG. 9.
Figure 12:
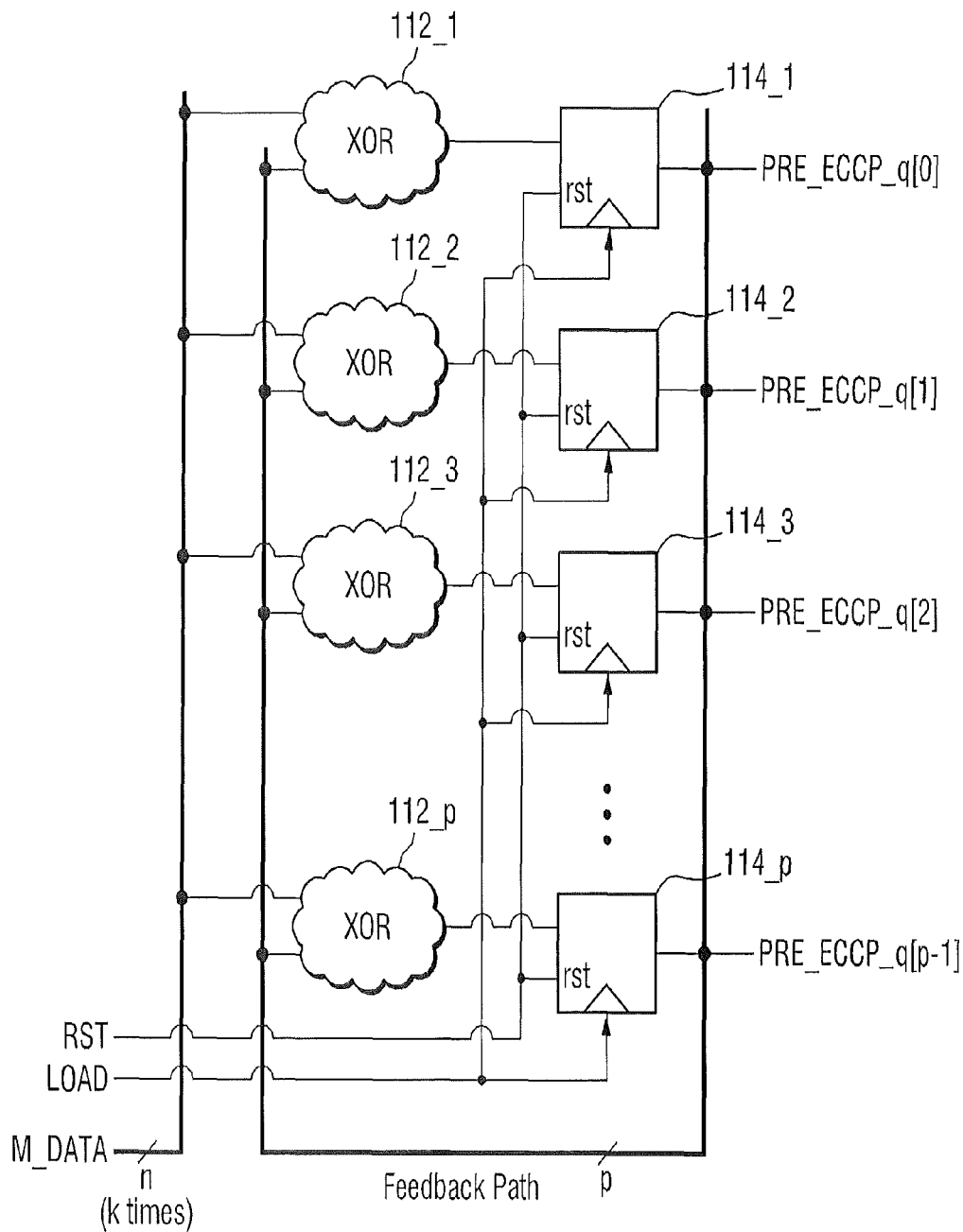
FIG. 12 is a circuit diagram of the encoder shown in FIG. 11.
Figure 13:
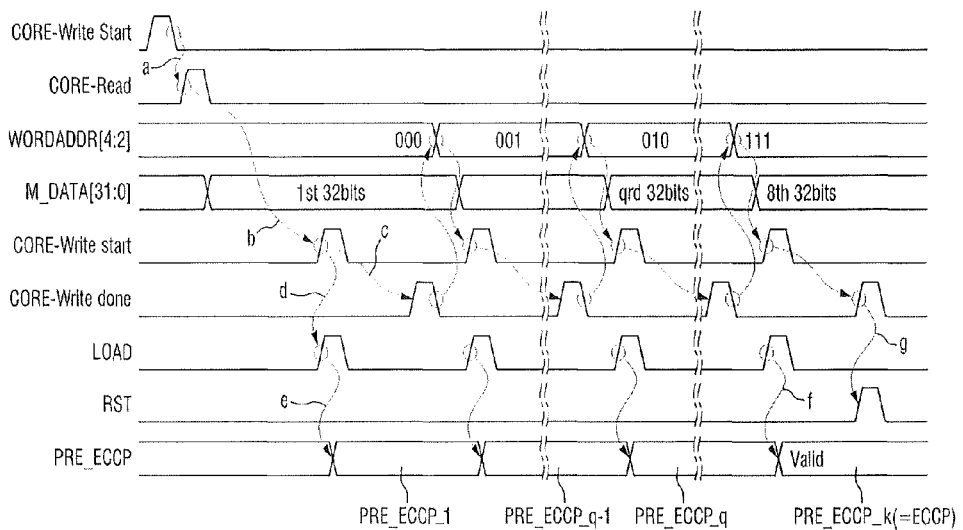
FIG. 13 is a timing diagram illustrating an operation of the encoder shown in FIG. 12.

FIG. 11 is a block diagram of an encoder shown in FIG. 9, FIG. 12 is a circuit diagram of the encoder shown in FIG. 11, and FIG. 13 is a timing diagram illustrating an operation of the encoder shown in FIG. 12.

Referring first to FIG. 11, the encoder 110 may include an XOR gate array 112, and a D flip-flop array 114.

The XOR gate array 112 outputs a pre-parity bit (PRE_ECCP). Referring to FIGS. 12 and 13, the pre-parity bit PRE_ECCP may mean sequentially generating k pre-parity bits (PRE_ECCP_1~PRE_ECCP_k). Here, the last output kth pre-parity bit (PRE_ECCP_k) may be a parity bit ECCP. In addition, each pre-parity bit (PRE_ECCP_q) may be p bits (Here, q is a natural number greater than 1 and equal to or smaller than k). For example, the pre-parity bit PRE_ECCP_q may include PRE_ECCP_q[0]~PRE_ECCP_q[p−1].

The XOR gate array 112 may include a plurality of XOR gates 112_1~112_p. Some bits selected from the n-bit message data M_DATA may be input to each of the XOR gates 112_1~112_p. In addition, the pre-parity bit PRE_ECCP_q may be fed back to and input to each of the XOR gates 112_1~112_p. The pre-parity bit PRE_ECCP_q may be fed back to at least one XOR gate among the plurality of XOR gates 112_1~112_p. For example, PRE_ECCP_k[0] may be fed back to two XOR gates 112_1 and 112_2), PRE_ECCP_k[1] may be fed back to two XOR gates 112_2 and 112_3, but aspects of present Inventive concepts are not limited thereto.

The D flip-flop array 114 may include a plurality of D flip-flops 114_1~114_p. Each of the D flip-flops 114_1~114_p may transmit the output of XOR gates (that is, the pre-parity bit PRE_ECCP_q) in response to a load signal (LOAD). Each of the D flip-flops 114_1~114_p may be reset in response to a reset signal (RST).

The operation of the encoder 110 will be summarized as follows with reference to FIGS. 12 and 13. For the sake of convenient explanation, the following description will focus on a case where each 32 bits of message data are sequentially input 8 times (that is to say, n=32 and k=8).

Referring to reference symbol a, if a CORE-Write Start signal is enabled, a CORE-Read signal is enabled.

Thereafter, addresses WORDADDR and message data M_DATA are sequentially input.

Referring to reference symbols b and c, as the CORE-Write start signal is enabled, the message data M_DATA is written on the memory core 190. If the write operation is completed, a CORE-Write Done signal is enabled.

Referring to reference symbols d and e, the XOR gate array 112 of the encoder 110 generates a first pre-parity bit (PRE_ECCP_1) using the pre-parity bit in a reset state and the message data M_DATA. If the load signal LOAD is input, the D flip-flop array 114 feeds back the first pre-parity bit PRE_ECCP_1.

That is to say, the XOR gate array 112 generates a qth pre-parity bit (PRE_ECCP_q) (Here, q is a natural number greater than 1 and equal to or smaller than k) using a (q−1)th pre-parity bit PRE_ECCP_q−1 and message data M_DATA. The (q−1)th pre-parity bit PRE_ECCP is fed back from the D flip-flop array 114.

The above-described operations are repeated. As a result, the kth pre-parity bit PRE_ECCP_k is generated (see reference symbol f). The kth pre-parity bit PRE_ECCP_k is output as a parity bit ECCP.

Referring to reference symbol g, after the parity bit ECCP is output, the D flip-flop array 114 is reset in response to the reset signal RST.

Figure 14:
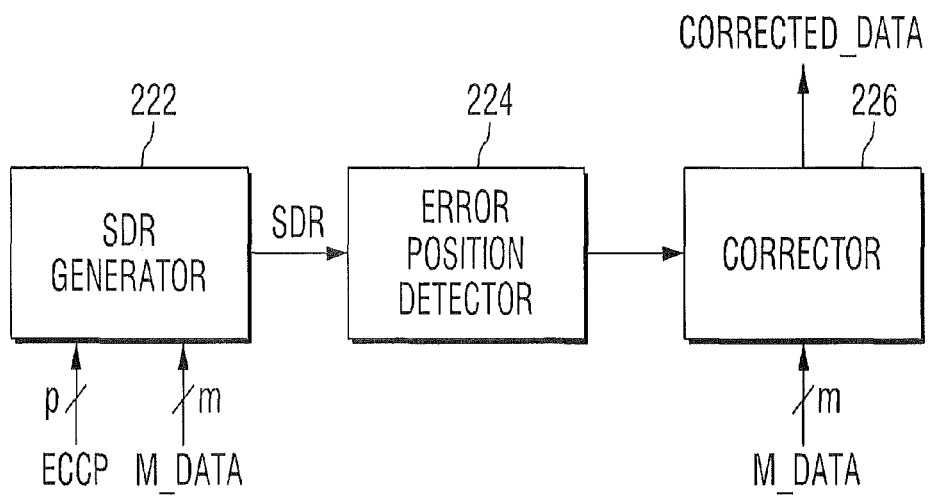
FIG. 14 is a block diagram of a decoder shown in FIG. 9.

FIG. 14 is a block diagram of a decoder shown in FIG. 9.

Referring to FIG. 14, the decoder 220 may include a syndrome generator 222, an error position detector 224, and an error corrector 226.

The syndrome generator 222 generates a syndrome SDR using the message data M_DATA and the parity bit ECCP. The error position detector 224 detects an error position of the message data M_DATA using the syndrome SDR. For example, the error position detector 224 calculates coefficients of an error position equation using two or more syndromes SDRs and detects the error position based on the coefficients. The error corrector 226 corrects an error of the message data M_DATA based on the detected error position. The corrected message data is denoted by CORRECTED_RSADATA.

Here, the decoder 220 may receive each in bits of message data M_DATA and may simultaneously decode m-bit message data M_DATA. Here, m may equal to n×k.

Meanwhile, the ECC encoding/decoding operations described with reference FIGS. 10 to 14 have been illustrated with regard to a case of correcting a 1-bit error. However, the description of the ECC encoding/decoding operations has been provided only for illustration, and may also be applied to a case of correcting errors of 2 or more bits.

Figure 15:
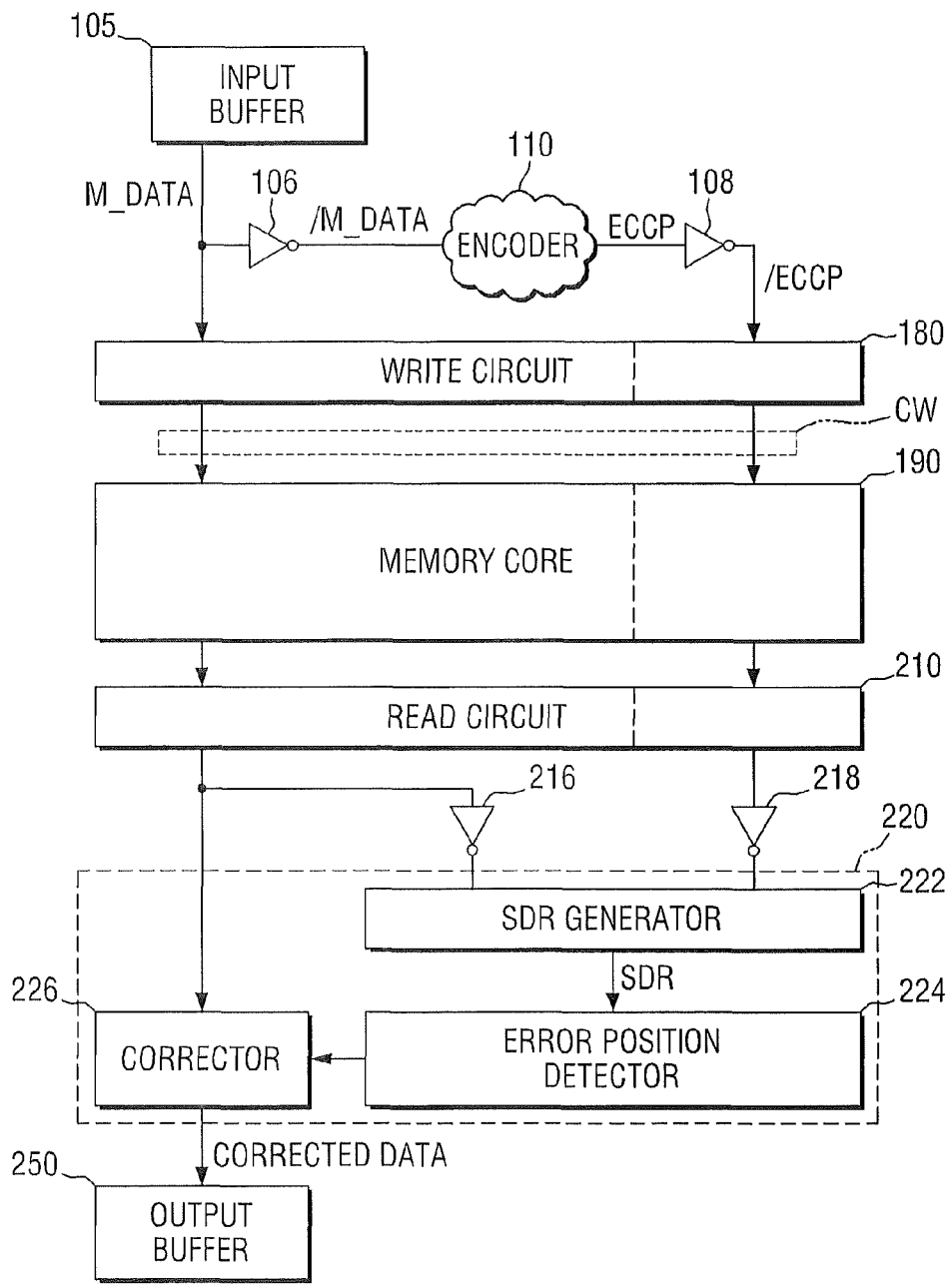
FIG. 15 is a block diagram of a nonvolatile memory device according to yet other embodiments of present Inventive concepts.
Figure 16:
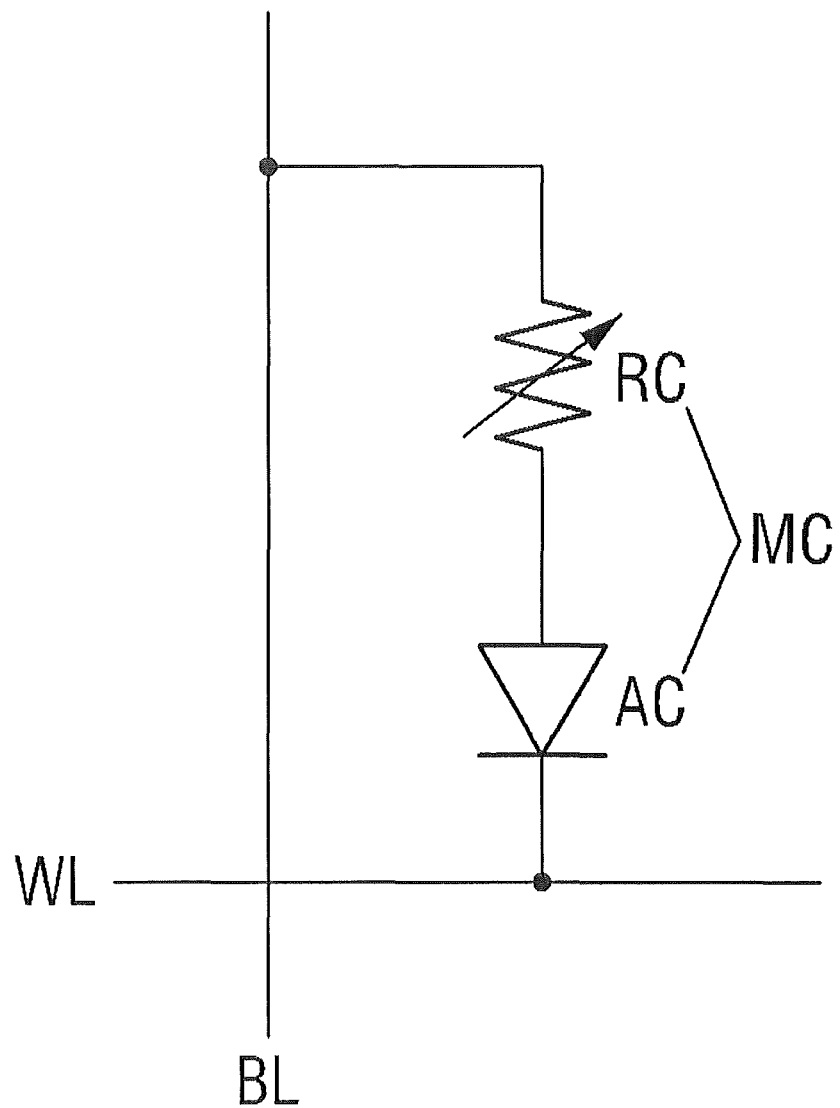
FIG. 16 illustrates an exemplary nonvolatile memory cell in a memory core shown in FIG. 15.

FIG. 15 is a block diagram of a nonvolatile memory device according to still other embodiments of present Inventive concepts, and FIG. 16 illustrates an exemplary nonvolatile memory cell in a memory core shown in FIG. 15.

The nonvolatile memory device 1 of FIG. 15 may include an input buffer 105, a first inversion unit 106, an encoder 110, a second inversion unit 108, a write circuit 180, a memory core 190, a read circuit 210, a third inversion unit 216, a fourth inversion unit 218, a decoder 220, and an output buffer 250. The decoder 220 may include a syndrome generator 222, an error position detector 224, and an error corrector 226. With this configuration, the nonvolatile memory device 1 according to still other embodiments of present Inventive concepts may perform an error correction operation using ECC.

The memory core 190 may include a plurality of nonvolatile memory cells (MC of FIG. 16). As shown in FIG. 15, the nonvolatile memory cell MC may include a variable resistive element (RC) and an access element (AC). The variable resistive element RC may have a phase-change material. For example, the phase-change materials may include various kinds of materials, such as binary atomic compounds (such as GaSb, InSb, InSe, $Sb_2Te_8$, or GeTe), ternary atomic compounds (such as GeSbTe, GaSeTe, InSbTe, $SnSb_2Te_4$, or InSbGe), and/or quaternary atomic compounds (such as AgInSbTe, (GeSn)SbTe, GeSb(SeTe), or $Te_{51}Ge_{15}Sb_2S_2$). For example, GeSbTe, which includes germanium (Ge), antimony (Sb), and tellurium (Te), may be generally used. In addition, the access element AC controls the current flowing through the variable resistive element RC. Here, the access element AC may be a diode or a transistor coupled to the variable resistive element RC in series. In the drawing, the variable resistive element RC is a diode. Meanwhile, the phase-change materials may have one of two stable states (i.e., a crystalline state and an amorphous state). The crystalline state is defined as a "set" state and the amorphous state is defined as a "reset" state. In addition, the set state corresponds to first logic data (e.g., logic "1") and the reset state corresponds to second logic data (e.g., logic "0").

The input buffer 105 receives message data M_DATA.

The first inversion unit 106 inverts the message data M_DATA and outputs inverted message data (/M_DATA).

The encoder 110 receives the inverted message data /M_DATA and generates a parity bit ECCP capable of correcting bit error. For example, the encoder 110 may generate a parity bit ECCP capable of correcting a 1-bit error, but aspects of present Inventive concepts are not limited thereto. The encoder 110 may be formed using XOR gates.

The second inversion unit 108 inverts the parity bit ECCP and outputs inverted parity bit (/ECCP).

The write circuit 180 writes the message data M_DATA and the inverted parity bit /ECCP on the memory core 190. Meanwhile, a codeword (CW) means a vector associated with ECC and stored in the memory core 190 by the write circuit 180. In FIG. 15, the codeword CW refers to "message data M_DATA+inverted parity bit /ECCP." In addition, a codeword group means a set of all vectors of the codeword CW.

The read circuit 210 reads the message data M_DATA and the inverted parity bit /ECCP stored in the memory core 190.

The third inversion unit 216 receives the message data M_DATA from the read circuit 210 and inverts the same. That is to say, the third inversion unit 216 outputs the inverted message data /M_DATA.

The fourth inversion unit 218 receives the inverted parity bit /ECCP from the read circuit 210, inverts the same and generates a parity bit ECCP.

The syndrome generator 222 receives the inverted message data /M_DATA from the third inversion unit 216 and the parity bit ECCP from the fourth inversion unit 218 and decodes the same. Through the aforementioned procedure, the syndrome SDR is generated.

The error position detector 224 detects an error position of the message data M_DATA using the syndrome SDR. For example, the error position detector 224 calculates coefficients of an error position equation using two or more syndromes SDRs and detects the error position based on the coefficients. The error corrector 226 corrects an error of the message data M_DATA based on the detected error position. The corrected message data is denoted by CORRECTED_RSADATA.

The output buffer 250 outputs the corrected message data CORRECTED_DATA to the outside.

Meanwhile, in the nonvolatile memory device of FIG. 15, a first inversion unit 106 and a second inversion unit 108 are respectively disposed at the input(s) and output(s) of the encoder 110. Therefore, the encoder 110 encodes the inverted message data /M_DATA and generates the parity bit ECCP. The inverted parity bit /ECCP is stored in the memory core 190. In the same manner, a codeword (CW) may be made a vector having all elements being first logic data (i.e., logic "1"). In particular, even with a nonvolatile memory device using ECC, the codeword CW may also be made a "vector having all elements being first logic data (i.e., logic "1"), which will be described in detail with reference to Table 1 below.

As described above, the encoder 110 may be formed using XOR gates.

As in CASE1, if the message data M_DATA is an "all one" vector (1, 1, 1 . . . , 1), that is, if the inverted message data /M_DATA is an "all zero" vector (0, 0, 0 . . . , 0), the encoder 110 may output the "all zero" vector (0, 0, 0 . . . , 0) as the parity bit ECCP. Therefore, the inverted parity bit /ECCP becomes an "all one" vector (1, 1, 1 . . . , 1). In the CASE1, a codeword becomes an "all one" vector (1, 1, 1, . . . , 1, 1, 1).

Meanwhile, as in CASE2, if the message data M_DATA is an "all zero" vector (0, 0, 0 . . . , 0), that is, if the inverted message data /M_DATA is an "all one" vector (1, 1, 1 . . . , 1), the encoder 110 may not output the "all one" vector (1, 1, 1, . . . , 1) but may output a preset vector, for example, (1, 0, . . . , 1). Therefore, in the CASE2, a codeword may not become an "all zero" vector (0, 0, 0, . . . , 0, 0, 0).

In addition, when a nonvolatile memory device (in particular, a memory chip or package) is bonded (e.g., soldered) on a circuit board, heat is applied to the nonvolatile memory device. After bonding, all phase-change memory cells in the nonvolatile memory device may become "set" states. Generally, the heat applied to the nonvolatile memory device is not high enough to reset phase-change memory cells to "reset" states. As described above, if the "set" states of the phase-change memory cells are made to correspond to first logic data (logic "1"), the first logic data are written on all of the phase-change memory cells after bonding. That is to say, all of the phase-change memory cells after bonding become "erase" states.

In some cases, particular data should be directly programmed on nonvolatile memory devices by manufacturers. In those cases, a throughput may be considerably affected by a data programming time. In particular, a memory device performing an erase operation before program operation may require an increased "erase operation time" in programming particular data. However, as described above, if all of the phase-change memory cells after bonding are reset to "erase" states, a separate erase operation time may not be necessary, thereby expediting the program operation.

Figure 17:
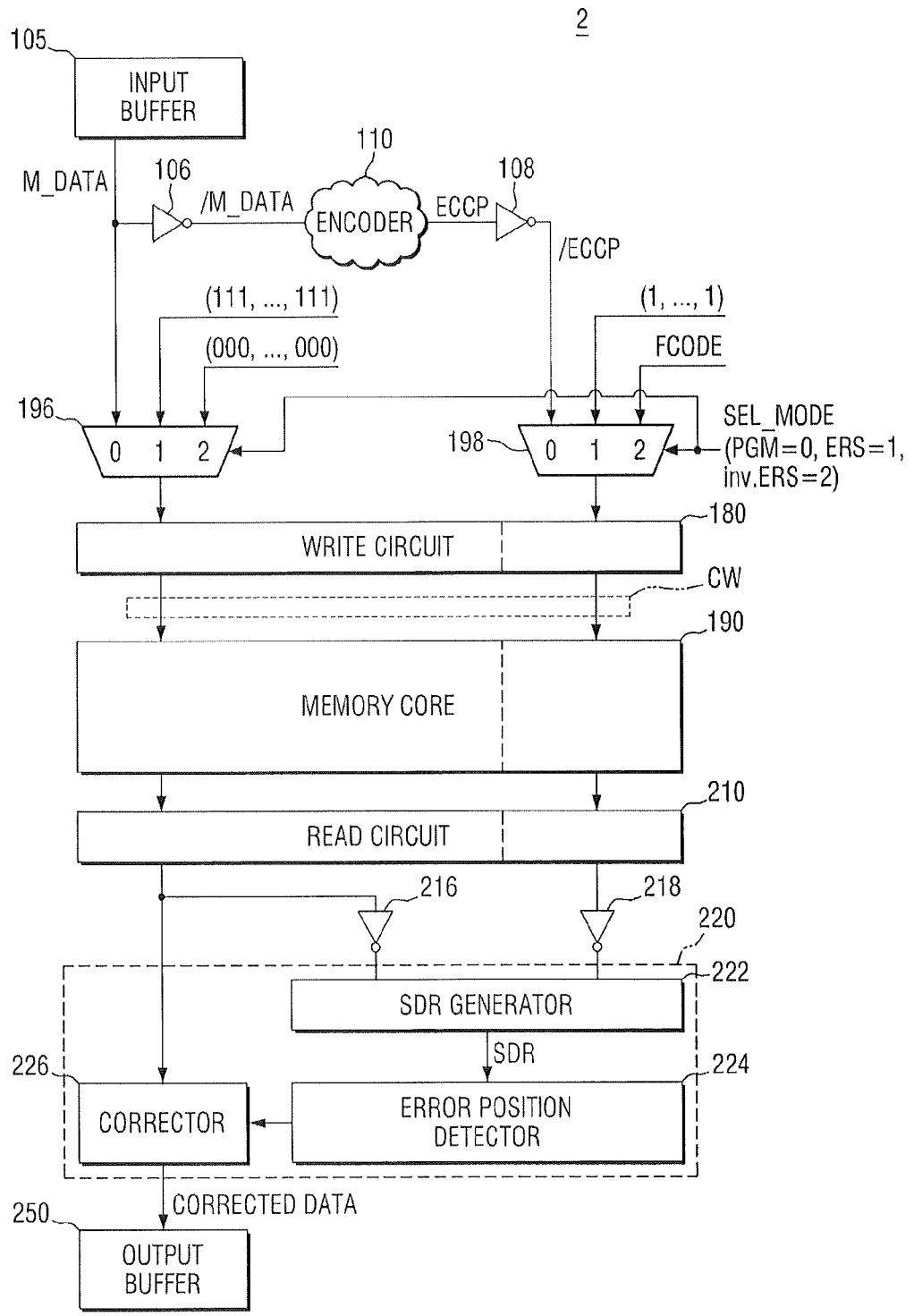
FIG. 17 is a block diagram of a nonvolatile memory device according to still other embodiments of present Inventive concepts.

FIG. 17 is a block diagram of a nonvolatile memory device according to still other embodiments of present Inventive concepts. For the sake of convenient explanation, the following description will focus on differences from the description of the nonvolatile memory device according to the previous embodiments of present Inventive concepts.

Referring to FIG. 17, in the nonvolatile memory device 2 according to still other embodiments of present Inventive concepts, during an erase operation, a write circuit 180 writes preset auxiliary message data, instead of message data M_DATA, on a memory core 190. Here, the erase operation may include a normal erase operation and an inverse erase operation. In the inverse erase operation, similar to a case of an inverse write operation, when an erase command is input, second logic data (logic "0"), instead of first logic data (logic "1"), is written. In the inverse write operation, if first logic data (logic "1")/second logic data (logic "0") are externally

TABLE 1

| | M_DATA | /M_DATA | ECCP | /ECCP | Codeword "M_DATA+/ECCP" |
|---|---|---|---|---|---|
| CASE 1 | (1, 1, 1 . . . , 1) | (0, 0, 0 . . . , 0) | (0, . . . , 0) | (1, . . . , 1) | (1, 1, 1, . . . , 1, 1, 1) |
| CASE 2 | (0, 0, 0 . . . , 0) | (1, 1, 1 . . . , 1) | Preset vector | Inverted preset vector | |

Consequently, in the nonvolatile memory device 1 of FIG. 15, a codeword group may include an "all one" vector (1, 1, 1, . . . , 1, 1, 1) in which all elements are first logic data (logic "1s") but not include an "all zero" vector (0, 0, 0, . . . , 0, 0, 0) in which all elements are second logic data (logic "0s"). Assuming that the codeword group is denoted by C, it can be expressed as follows:

$$(1,1,1\ldots 1,1,1)\in C.$$

$$(0,0,0\ldots 0,0,0)\notin C.$$

In the nonvolatile memory device according to still other embodiments of present Inventive concepts, since the codeword CW can be made an "all one" vector in which all elements are first logic data (logic "1 s"), the first logic data (logic "1") can be written on the entire region erased from the memory core 190.

input, the second logic data (logic "0")/first logic data (logic "1") are written on the memory core 190.

In detail, a first selector 196 selects one of preset auxiliary message data, instead of message data M_DATA, in response to a selection signal (SEL_MODE). The first selector 196 transmits the selected data to the write circuit 180. Here, the selection signal SEL_MODE is a signal for selecting one of a write operation (PGM), a normal erase operation (ERS), and an inverse erase operation (inv.ERS). The auxiliary message data used in the normal erase operation ERS is an "all one" vector (1, 1, 1, . . . , 1, 1, 1) in which all elements are first logic data (logic "1 s"), and the auxiliary message data used in the inverse erase operation inv.ERS is an "all zero" vector (0, 0, 0, . . . , 0, 0, 0) in which all elements are second logic data (logic "0s").

In addition, during the erase operation, the write circuit 180 applies a value corresponding to a preset encoder output without passing through an encoder 110, and writes an auxiliary parity bit on the memory core 190.

In detail, the second selector 198 selects one of preset auxiliary parity bits, instead of inverted parity bit (/ECCP), in response to the selection signal SEL_MODE. The second selector 198 transmits the selected bit to the write circuit 180. The auxiliary message data used in the normal erase operation ERS is an "all one" vector (1, 1, 1, ..., 1, 1, 1) in which all elements are first logic data (logic "1s"), and the auxiliary parity bit used in the inverse erase operation inv.ERS is a preset vector (FCODE). Here, the preset vector FCODE may not be an "all zero" vector in which all elements are second logic data (logic "0"). As described above with reference to FIG. 15, a codeword group includes an "all one" vector (1, 1, 1, ..., 1, 1, 1) in which all elements are first logic data (logic "1s") but does not include an "all zero" vector (0, 0, 0, ..., 0, 0, 0) in which all elements are second logic data (logic "0s").

During an erase operation, an erase time can be shortened by using auxiliary message data, instead of message data M_DATA, and using auxiliary parity bits, instead of inverted parity bits ECCP. In particular, since the auxiliary parity bits are not subjected to read, message data combination and encoding operations, the erase time can be further shortened.

Figure 18:
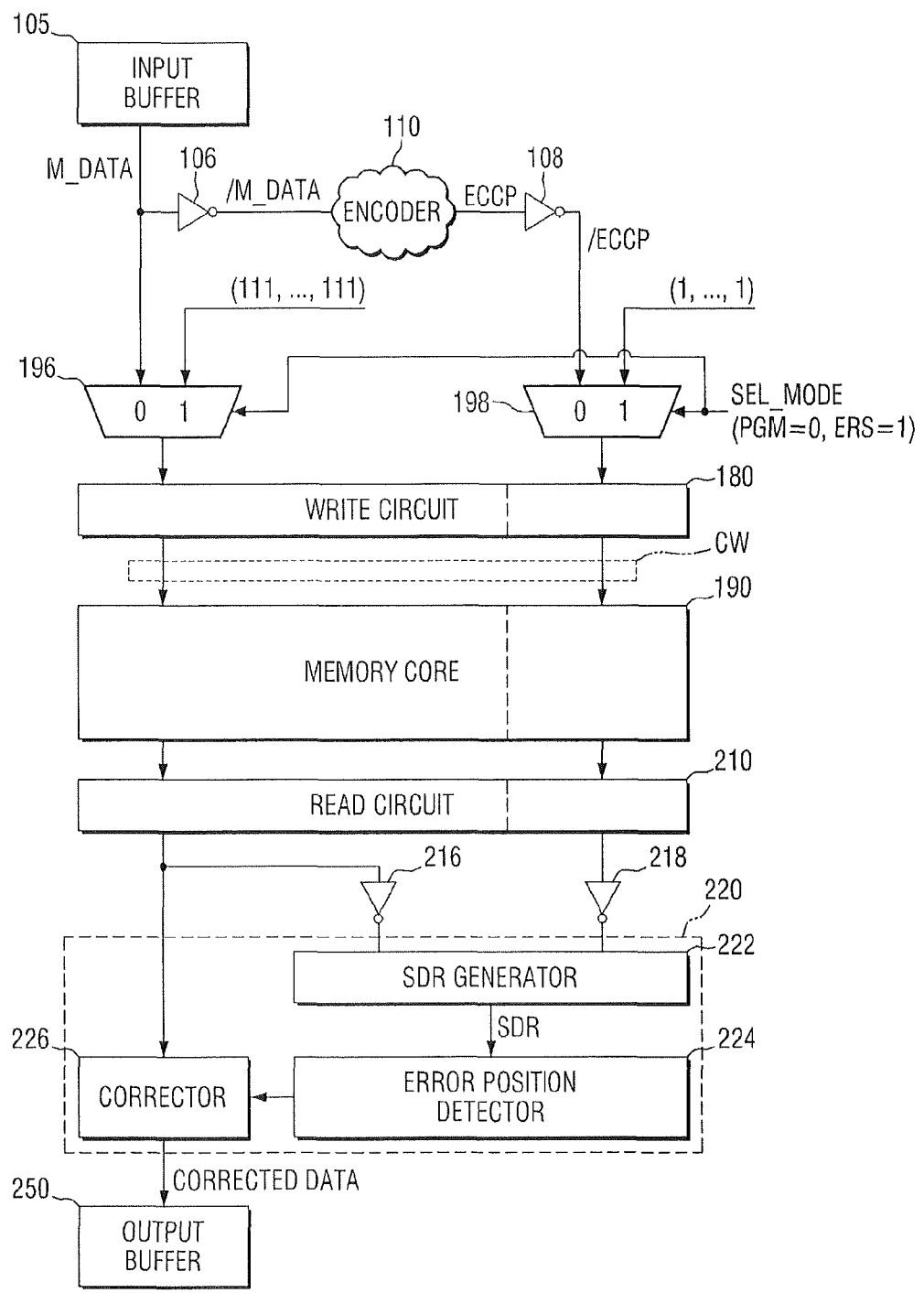
FIG. 18 is a block diagram of a nonvolatile memory device according to yet other embodiments of present Inventive concepts.

FIG. 18 is a block diagram of a nonvolatile memory device according to still other embodiments of present Inventive concepts.

For the sake of convenient explanation, the following description will focus on differences from the description of the nonvolatile memory device according to the previous embodiment of present Inventive concepts. Referring to FIG. 18, in the nonvolatile memory device 3 according to still another embodiment of present Inventive concepts, only a normal erase operation is performed but an inverse erase operation is not performed. Therefore, a selection signal SEL_MODE is a signal used to select one of a write operation (PGM) and a normal erase operation (ERS).

Figure 19:
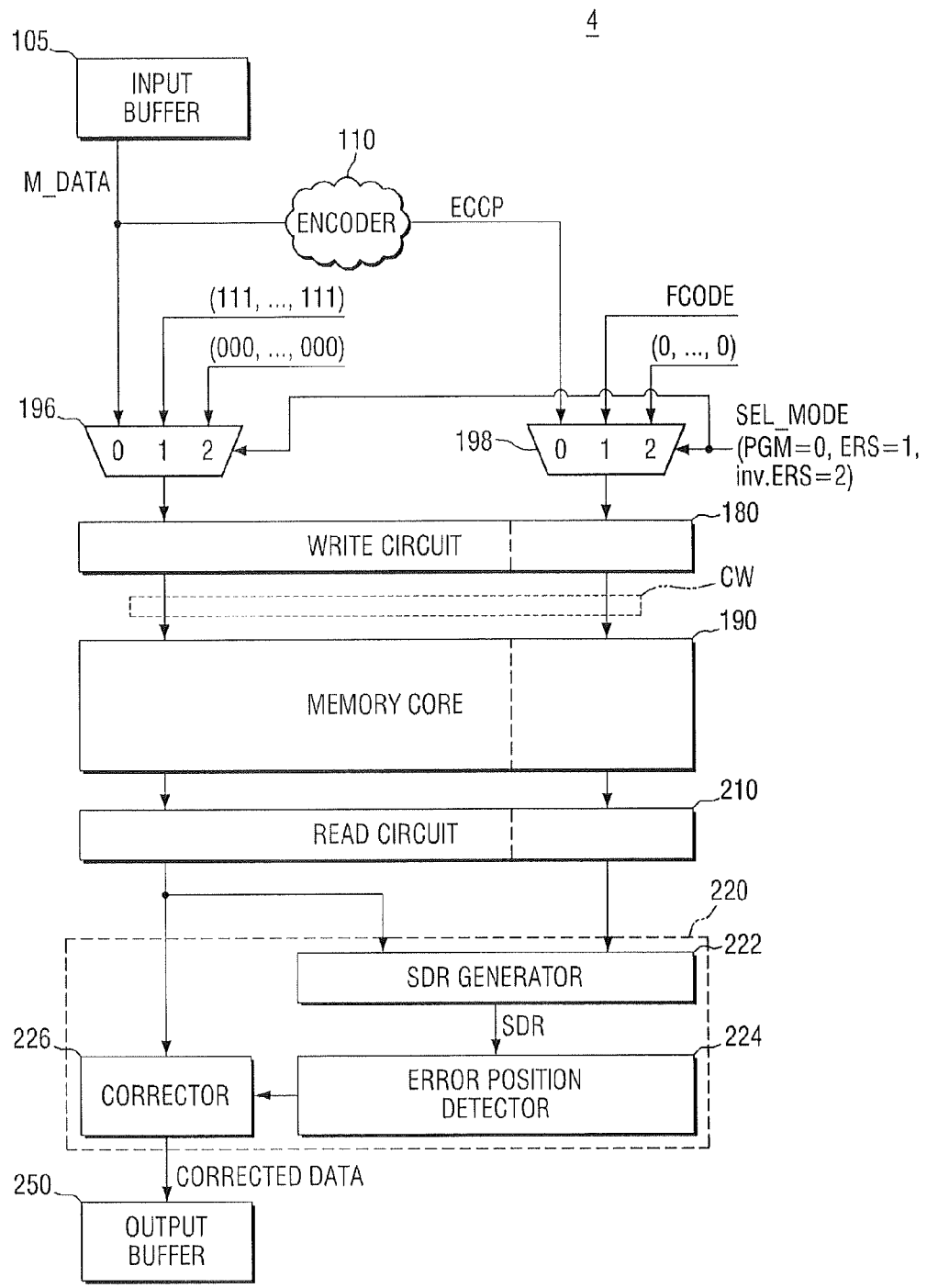
FIG. 19 is a block diagram of a nonvolatile memory device according to still other embodiments of present Inventive concepts.

FIG. 19 is a block diagram of a nonvolatile memory device according to still other embodiments of present Inventive concepts.

For the sake of convenient explanation, the following description will focus on differences from the description of the nonvolatile memory device according to previous embodiments of present Inventive concepts.

In the nonvolatile memory device 4 of FIG. 19, a "set" state of a phase-change memory cell MC corresponds to first logic data (e.g., logic "1") and a "reset" state of a phase-change memory cell MC corresponds to second logic data (e.g., logic "0").

In the nonvolatile memory device 4, the "set" state of a phase-change memory cell MC corresponds to second logic data (e.g., logic "0") and the "reset" state of a phase-change memory cell MC corresponds to first logic data (e.g., logic "1").

Therefore, in the nonvolatile memory device 4, a codeword group includes an "all zero" vector (0, 0, 0, ..., 0, 0, 0) in which all elements are second logic data (logic "0s") but does not include an "all one" vector (1, 1, 1, ..., 1, 1, 1) in which all elements are first logic data (logic "1s"). Assuming that the codeword group is denoted by C, it can be expressed as follows:

$(1,1,1 \ldots 1,1,1) \notin C.$ $(0,0,0 \ldots 0,0,0) \in C.$

During an erase operation, the write circuit 180 writes preset auxiliary message data, instead of message data M_DATA, on the memory core 190.

In detail, the first selector 196 selects one of preset auxiliary message data, instead of message data M_DATA, in response to a selection signal (SEL_MODE). The first selector 196 transmits the selected data to the write circuit 180. Auxiliary message data used in a normal erase operation ERS is an "all one" vector (1, 1, 1, ..., 1, 1, 1) in which all elements are first logic data (logic "1"), and auxiliary message data used in the inverse erase operation inv.ERS is a vector (0, 0, 0, ..., 0, 0, 0) in which all elements are second logic data (logic "0").

During an erase operation, the write circuit 180 applies a value corresponding to a preset encoder output without passing through the encoder 110, and writes an auxiliary parity bit on the memory core 190.

In detail, a second selector 198 selects one of preset auxiliary parity bits, instead of inverted parity bit (/ECCP), in response to the selection signal SEL_MODE. The second selector 198 transmits the selected data to the write circuit 180. Auxiliary message data used in a normal erase operation ERS is a preset vector (FCODE). Here, the preset vector FCODE may not be an "all one" vector in which all elements are first logic data (logic "1"). In addition, the auxiliary parity bits used in the inverse erase operation (inv.ERS) is an "all zero" vector (0, 0, 0, ..., 0, 0, 0) in which all elements are second logic data (logic "0"). As described above, a codeword group includes an "all zero" vector (0, 0, 0, ..., 0, 0, 0) in which all elements are second logic data (logic "0") but does not include an "all one" vector (1, 1, 1, ..., 1, 1, 1) in which all elements are first logic data (logic "1"). During an erase operation, an erase time can be shortened by using auxiliary message data, instead of message data M_DATA, and using auxiliary parity bits, instead of parity bits ECCP. In particular, since the auxiliary parity bits are not subjected to read, message data combination and encoding operations, the erase time can be further shortened.

As described above, after a nonvolatile memory device (in particular, a memory chip or package) is bonded on a circuit board, all of the phase-change memory cells MC in the nonvolatile memory device may become "set" states. In the nonvolatile memory device 4 according to still other embodiments of present Inventive concepts, the "set" state of a phase-change memory cell MC corresponds to second logic data (e.g., logic "0") and a "reset" state of a phase-change memory cell MC corresponds to first logic data (e.g., logic "1"). Therefore, it is considered that all of the phase-change memory cells MC in the nonvolatile memory device after bonding are inversely erased. That is to say, all of the phase-change memory cells MC after bonding are not necessarily inversely erased before an inverse write operation.

Figure 20:
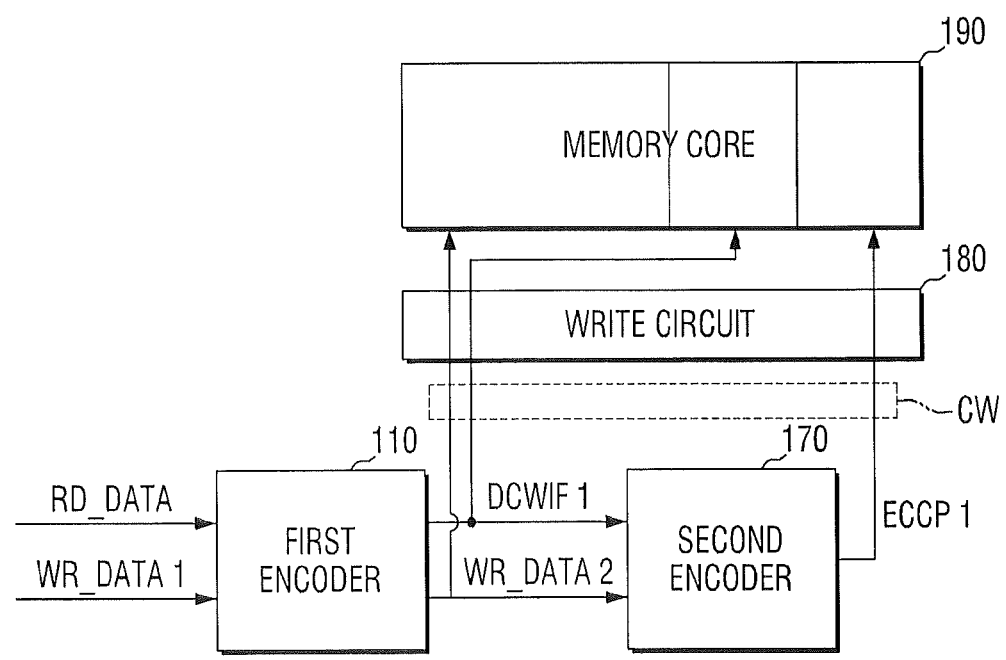
FIG. 20 is a block diagram of a nonvolatile memory device according to yet other embodiments of present Inventive concepts.
Figure 21:
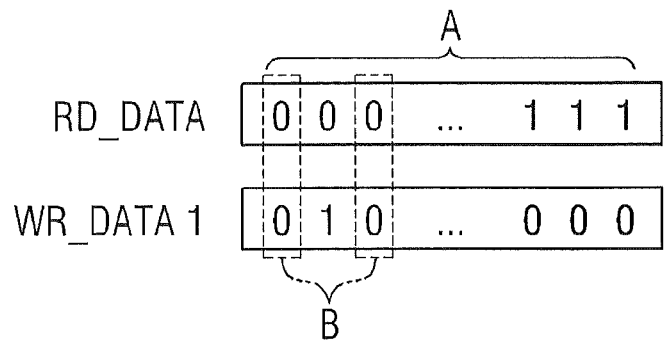
FIG. 21 is a diagram illustrating an operation of a first encoder shown in FIG. 20.
Figure 22:
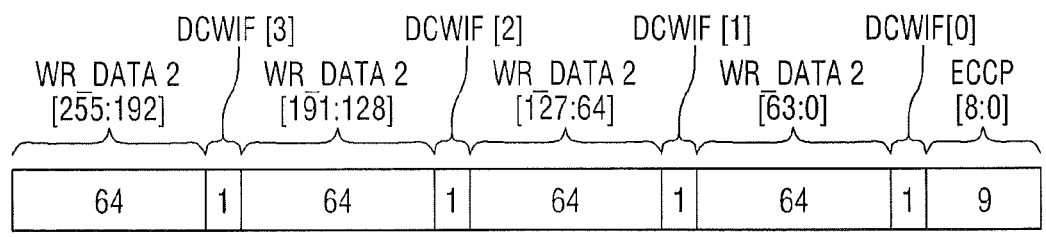
FIG. 22 illustrates a codeword (CW) shown in FIG. 20.
Figure 23:
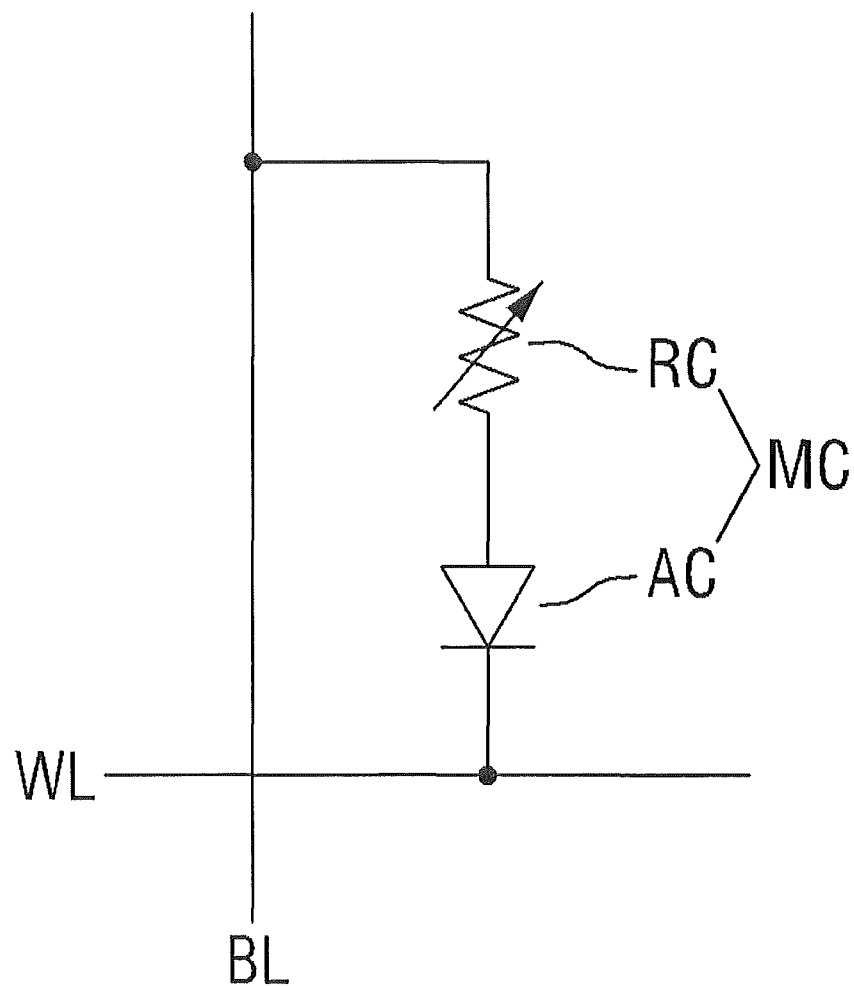
FIG. 23 illustrates an exemplary nonvolatile memory cell in a memory core shown in FIG. 20.

FIG. 20 is a block diagram of a nonvolatile memory device according to some embodiments of present Inventive concepts, FIG. 21 is a diagram illustrating an operation of a first encoder shown in FIG. 20, FIG. 22 illustrates a codeword CW shown in FIG. 20, and FIG. 23 illustrates an example of a nonvolatile memory cell in a memory core shown in FIG. 20.

Referring to FIG. 20, the nonvolatile memory device 1 according to some embodiments of present Inventive concepts may include a first encoder 110, a second encoder 120, a write circuit 180, and a memory core 190. With this configuration, the nonvolatile memory device 1 according to some embodiments of present Inventive concepts may perform a DCWIF (Data Comparative Write with Inversion Flag) operation and error correction operation using ECC.

In detail, the nonvolatile memory device 1 of FIG. 20 first write data WR_DATA1 with read data RD_DATA, and writes one of first write data WR_DATA1 and inverted data of the first write data WR_DATA1, the one with a smaller number of write operations, on the memory core 190, which is referred to as a DCWIF (Data Comparative Write with Inversion Flag). In addition, to increase reliability of the DCWIF operation, the error correction operation using ECC is performed.

The first encoder 110 receives first write data WR_DATA1 and read data RD_DATA. Next, the first write data WR_DATA1 and the read data RD_DATA are matched, and as the matching result, a first inversion flag DCWIF1 and second write data WR_DATA2 are generated.

The read data RD_DATA may be data generated in a read operation to be described later with reference to FIGS. 26 and 27. The read data RD_DATA may be data stored in an address in which the first write data WR_DATA1 is to be written.

For example, as shown in FIG. 21, it is assumed that first write data WR_DATA1 is "010 . . . 000" and read data RD_DATA is "000 . . . 111," In addition, it is assumed that the first write data WR_DATA1 and the read data RD_DATA are A bits (Here, A is a natural number greater than or equal to 2).

The first write data WR_DATA1 and the read data RD_DATA may be matched to each other bit by bit. As shown in FIG. 21, the first write data WR_DATA1 and the read data RD_DATA may be matched to each other in units of B bits.

If the number B of matched bits is greater than a predefined reference C, second write data WR_DATA2 output from the first encoder 110 may be non-inversion data. That is to say, the second write data WR_DATA2 may be the same as the first write data WR_DATA1. In addition, since the first inversion flag DCWIF1 indicates whether to invert or not the first write data WR_DATA1, the first inversion flag DCWIF1 may be logic "0" indicating a non-inversion state.

If the number B of matched bits is smaller than the predefined reference C, the second write data WR_DATA2 output from the first encoder 110 may be inversion data. In addition, the first inversion flag DCWIF1 may be logic "1" indicating an inversion state.

In addition, if the number B of matched bits is equal to the predefined reference C, the second write data WR_DATA2 may be in a non-inversion state or an inversion state. That is to say, if the number B of matched bits is equal to the predefined reference C, it may be determined according to necessity or may be determined to be suitable for performance of a nonvolatile memory device.

Here, the reference C may be, for example, half (½) the number A of bits of the first write data WR_DATA1, but aspects of present Inventive concepts are not limited thereto. The reference C may be an appropriate value determined by simulation. In addition, the reference C may be a preset value determined by a manufacturer in the course of manufacturing a nonvolatile memory device, or set by a user according to necessity.

Consequently, if the number B of matched bits is greater than the predefined reference C (that is, if the first write data WR_DATA1 and the read data RD_DATA are similar to each other), the first write data WR_DATA1 is stored as it is in the memory core 190. If the number B of matched bits is smaller than the predefined reference C, (that is, if inversion data of the first write data WR_DATA1 and the read data RD_DATA are similar to each other), the inversion data of the first write data WR_DATA1 is stored in the memory core 190.

For brevity of explanation, the foregoing description has been made with regard to a case where the first inversion flag DCWIF1 is 1 bit, but aspects of present Inventive concepts are not limited thereto.

Referring again to FIG. 20, the second encoder 120 receives second write data WR_DATA2 and first inversion flag DCWIF1. Next, the second encoder 120 encodes the second write data WR_DATA2 and the first inversion flag DCWIF1 and generates first parity bits ECCP. Here, the second encoder 120 performs coding in various manners, but the coding method is not limited to a particular coding method.

The first inversion flag DCWIF1 indicates whether the first write data WR_DATA1 has been inverted or not. That is to say, the first inversion flag DCWF1 indicates inversion information associated with the second write data WR_DATA2. The first inversion flag DCWF1 indicates whether or not "the second write data WR_DATA2 has been inverted and generated from the first write data WR_DATA1." Therefore, if there is an error in the first inversion flag DCWIF1, the second write data WR_DATA2 is not reliable. Therefore, in the nonvolatile memory device according to some embodiment of present Inventive concepts, not only the second write data WR_DATA2 but also the first inversion flag DCWIF1 are coded using ECC.

The first inversion flag DCWIF1, the second write data WR_DATA2, and the first parity bit ECCP1 generated in the above-described manner are transmitted to the write circuit 180. The write circuit 180 writes the first inversion flag DCWIF1, the second write data WR_DATA2, and the first parity bit ECCP1 on the memory core 190.

"First inversion flag DCWIF1+second write data WR_DATA2+first parity bit ECCP1" may be referred to as a "codeword (CW)." An exemplary codeword CW will be described with reference to FIG. 22.

In detail, 1 bit may be allocated to the first inversion flag DCWIF1 for each 64 bits of the second write data WR_DATA2. The 1-bit first inversion flag DCWIF1 indicates an inversion state of the 64-bit second write data WR_DATA2. For example, DCWP[0] indicates whether WR_DATA2[63:0] has been inverted.

In addition, it is assumed that the first parity bit ECCP1 is capable of correcting 1-bit error of one of the second write data WR_DATA2 and the first inversion flag DCWIF1. Then, since a total number of bits of the second write data WR_DATA2 and the first inversion flag DCWIF1 is (64+1)*4=260 and $2^8<260<2^9$, the first parity bit ECCP may include 9 bits.

Meanwhile, the memory core 190 may include a plurality of nonvolatile memory cells (MC of FIG. 23). The nonvolatile memory cells MC may write or read data using a resistance material. The nonvolatile memory cell MC may include a variable resistive element (RC) having a phase-change material having different resistance levels according to data stored, and an access element (AC) that controls the current flowing through the variable resistive element RC. Here, the access element AC may be a diode or a transistor coupled to the variable resistive element RC in series. In the drawing, the variable resistive element RC is a diode. In addition, the phase-change materials may include various kinds of materials, such as binary atomic compounds (such as GaSb, InSb, InSe, $Sb_2Te_8$, or GeTe), ternary atomic compounds (such as GeSbTe, GaSeTe, InSbTe, $SnSb_2Te_4$, or InSbGe), and/or quaternary atomic compounds (such as AgInSbTe, (GeSn)SbTe, GeSb(SeTe), or $Te_{51}Ge_{15}Sb_2S_2$). For example, GeSbTe, which consists of germanium (Ge), antimony (Sb), and tellurium (Te), may be generally used.

In the nonvolatile memory cell MC, a write operation may be performed more slowly than a read operation. In addition, since the write operation is performed using a high level write current, the endurance of the nonvolatile memory cell MC may be reduced as the write operation is repeated.

Like in the nonvolatile memory device 1 according to some embodiments of present Inventive concepts, if a DCWIF (Data Comparative Write with Inversion Flag) operation is performed, the number of write operations can be reduced and/or minimized, thereby improving the endurance of the nonvolatile memory cell MC. In addition, since the second write data WR_DATA2 and the first inversion flag DCWIF1 are both ECC coded, stability of the DCWIF operation can be enhanced.

Figure 24:
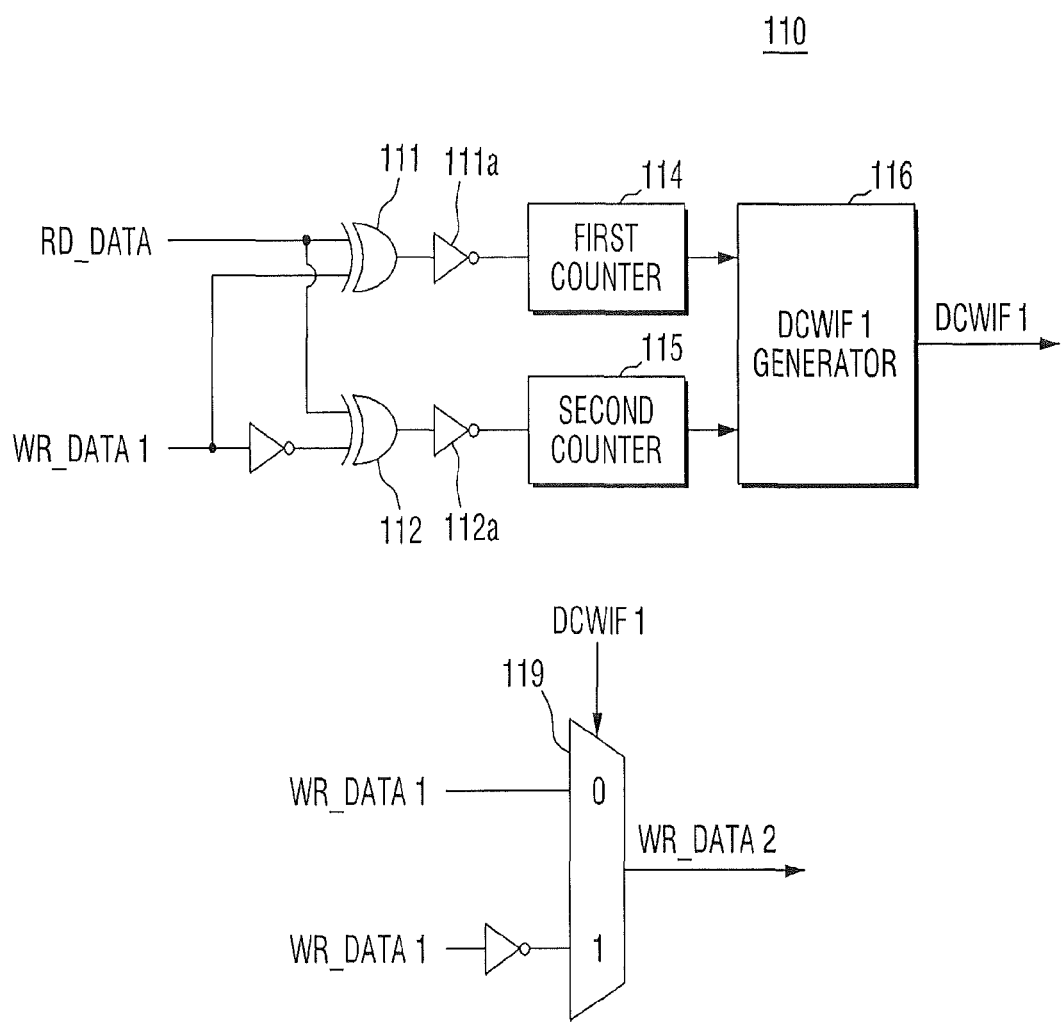
FIG. 24 is a circuit diagram of a first encoder shown in FIG. 20.
Figure 25:
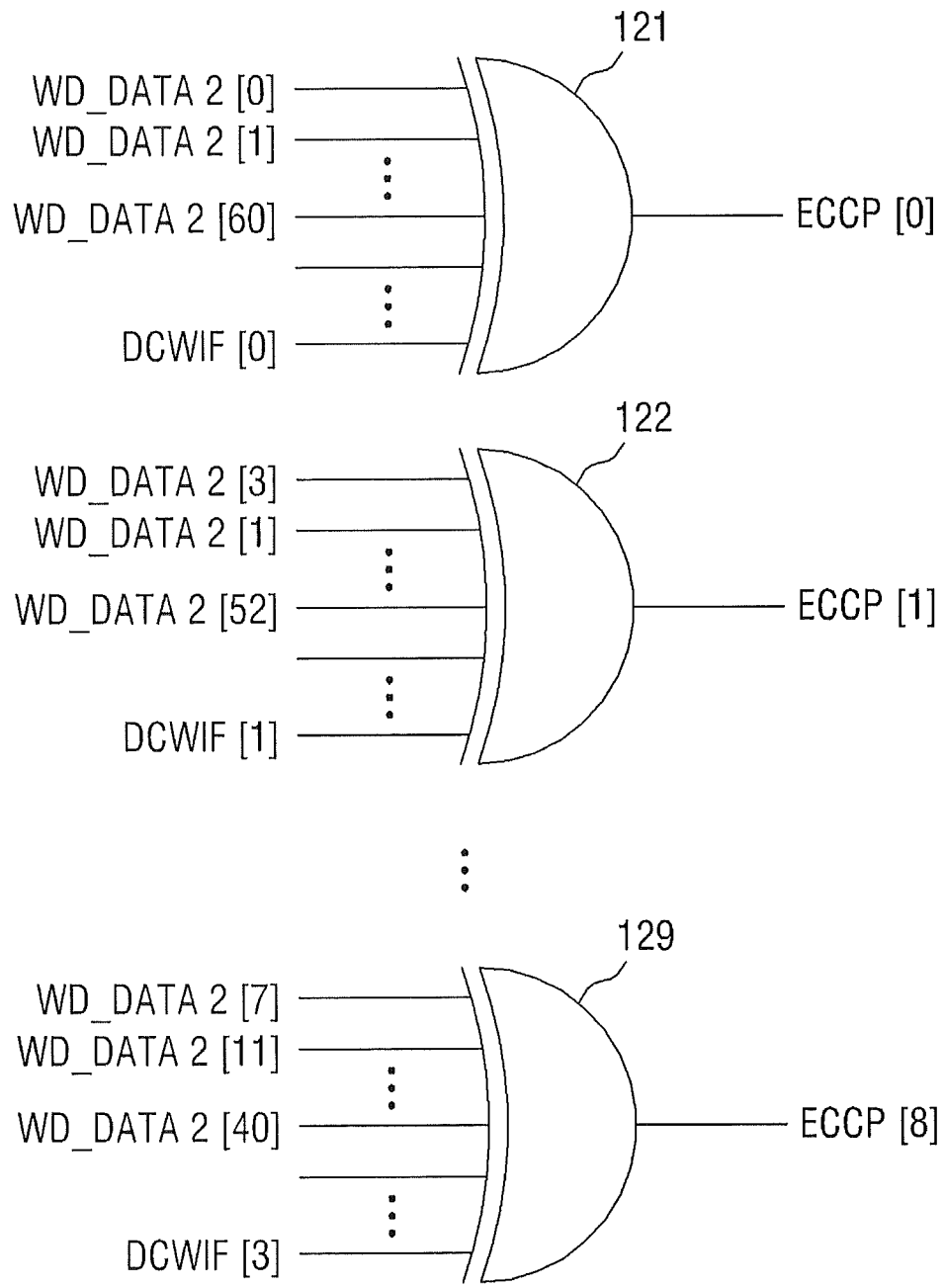
FIG. 25 is a circuit diagram of a second encoder shown in FIG. 20.

Next, a first encoder 110 and a second encoder 120 will be described in detail with reference to FIGS. 24 and 25. FIG. 24 is a circuit diagram of a first encoder shown in FIG. 20, and FIG. 25 is a circuit diagram of a second encoder shown in FIG. 20.

Referring to FIG. 24, the first encoder 110 includes a first XOR gate 111, a second XOR gate 112, a first counter 114, a second counter 115, a flag generator 116, and a selector 119.

The first XOR gate 111 receives the first write data WR_DATA1 and the read data RD_DATA and outputs data of logic "0" whenever the first write data WR_DATA1 and the read data RD_DATA are matched to each other, and the inverter 111a inverts the same and outputs data of logic "1." The first counter 114 counts the number of data of logic "1 s." That is to say, the first counter 114 counts the number of matched bits of the first write data WR_DATA1 and the read data RD_DATA.

In addition, the second XOR gate 112 receives inversion data of the first write data WR_DATA1 and the read data RD_DATA and outputs data of logic "0" whenever the inversion data of the first write data WR_DATA1 and the read data RD_DATA are matched to each other, and the inverter 112a inverts the same and outputs data of logic "1." The second counter 115 counts the number of data of logic "1s." That is to say, the second counter 115 counts the number of matched bits of the inversion data of the first write data WR_DATA1 and the read data RD_DATA.

The flag generator 116 compares the number of bits counted by the first counter 114 with the number of bits counted by the second counter 115 and generates a first inversion flag DCWIF1. For example, the flag generator 116 may be a subtractor. The subtractor may obtain a difference between the number of bits counted by the first counter 114 and the number of bits counted by the second counter 115, and the first inversion flag DCWIF1 based on the subtraction result. That is to say, if the number of bits counted by the first counter 114 is greater than the number of bits counted by the second counter 115, the first inversion flag DCWIF1 indicating a non-inversion state is generated. If the number of bits counted by the second counter 115 is greater than the number of bits counted by the first counter, the first inversion flag DCWIF1 indicating an inversion state is generated.

In addition, the selector 119 may output the first write data WR_DATA1 as it is as the second write data WR_DATA2 according to the first inversion flag DCWIF1. Alternatively, the selector 119 may invert the first write data WR_DATA1 and output inversion data of the first write data WR_DATA1 as the second write data WR_DATA2.

While FIG. 24 shows that it is determined by the first inversion flag DCWIF1 whether to output the first write data WR_DATA1 as it is or to invert the same to be output, present Inventive concepts is not limited thereto.

Referring to FIG. 25, the second encoder 120 may implement, for example, a generator polynomial. The second encoder 120 may include a plurality of XOR gates 121 to 129. Each of the XOR gates 121 to 129 may receive some of the second write data WR_DATA2 and the first inversion flag DCWIF1. The circuit diagram of the second encoder 120 shown in FIG. 25 is shown only for illustration, but aspects of present Inventive concepts are not limited thereto.

The operation of the nonvolatile memory device 1 according to some embodiments of present Inventive concepts will be summarized as follows with reference to FIGS. 20 to 25. The first write data WR_DATA1 and the read data RD_DATA are matched to generate the first inversion flag DCWIF1 to determine whether to invert or not the first write data WR_DATA1. The first write data WR_DATA1 is inverted or not according to the first inversion flag DCWIF1 to generate the second write data WR_DATA2. The second write data WR_DATA2 and the first inversion flag DCWIF1 are ECC coded to generate a first parity bit ECCP1. The second write data WR_DATA2, the first inversion flag DCWIF1 and the first parity bit ECCP1 are stored in the memory core 190.

Figure 26:
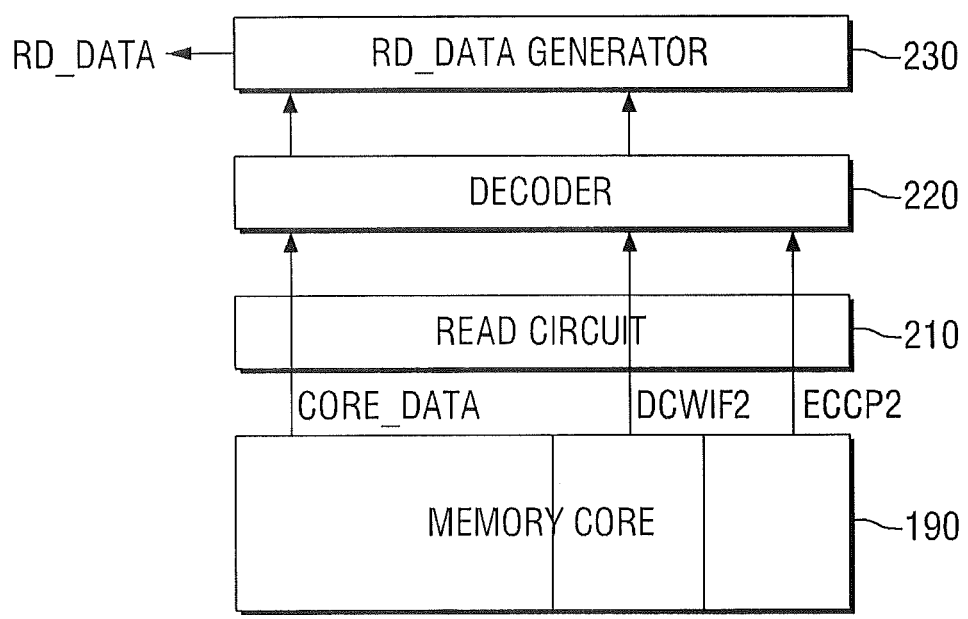
FIG. 26 is a block diagram of a nonvolatile memory device according to some other embodiments of present Inventive concepts.

FIG. 26 is a block diagram of a nonvolatile memory device according to some embodiments of present Inventive concepts. In FIG. 26, a description will focus on a read operation of the nonvolatile memory device. FIG. 27 is a block diagram of a decoder shown in FIG. 26.

The nonvolatile memory device 1 of FIG. 26 may include a read circuit 210, a decoder 220, and a data generator 230. With this configuration, the nonvolatile memory device 1 may read written data through a DCWIF operation and an error correcting operation using ECC.

The memory core 190 stores core data (CORE_DATA), a second inversion flag (DCWIF2), and a second parity bit (ECCP2). Here, the core data CORE_DATA, the second inversion flag DCWIF2 and the second parity bit ECCP2 may be stored in the manner described with respect to FIGS. 20 to 25.

A decoder 220 detects errors of the core data CORE_DATA and the second inversion flag DCWIF2 using the second parity bit ECCP2 and corrects the errors.

Figure 27:
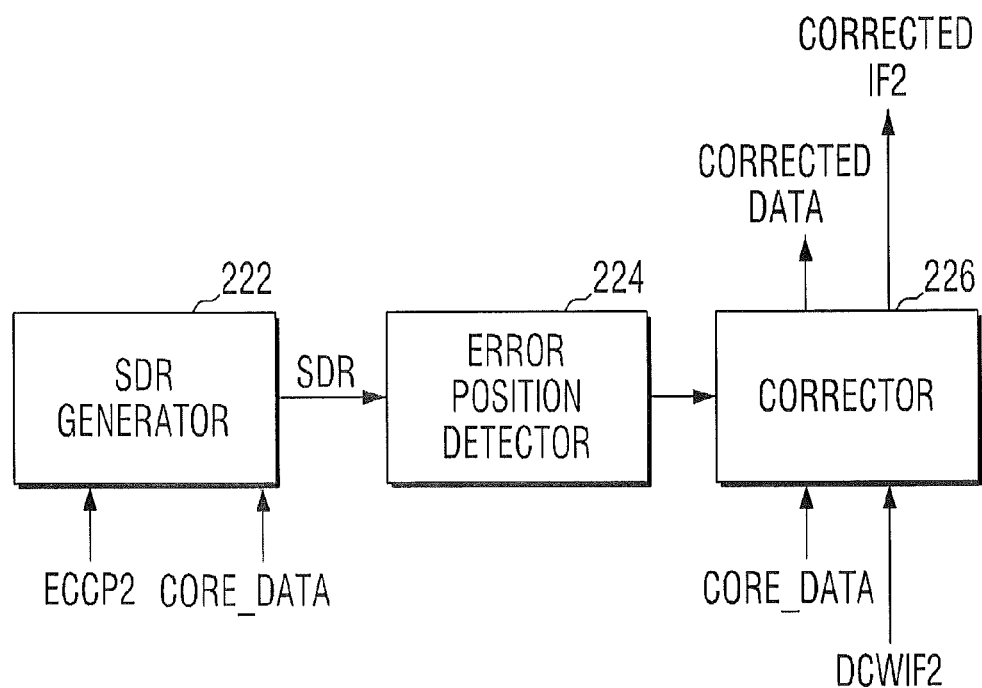
FIG. 27 is a block diagram of a decoder shown in FIG. 26.

Referring to FIG. 27, the decoder 220 may include a syndrome generator 222, an error position detector 224; and an error corrector 226.

The syndrome generator 222 generates a syndrome (SDR) using the second parity bit ECCP2. The error position detector 224 detects an error position of the core data CORE_DATA and the second inversion flag DCWIF2 using the syndrome SDR. For example, the error position detector 224 calculates coefficients of an error position equation using two or more syndromes SDRs and detects the error position based on the coefficients. The error corrector 226 corrects an error of the core data CORE_DATA or the second inversion flag DCWIF2 based on the detected error position. The corrected core data is denoted by CORRECTED_DATA and the corrected second inversion flag DCWIF2 is denoted by CORRECTED_IF2.

Referring again to FIG. 26, the data generator 230 inverts or not the corrected core data CORRECTED_DATA according to the corrected second inversion flag CORRECTED_IF2 and outputs the same as read data RD_DATA. That is to say, if the corrected second inversion flag CORRECTED_IF2 indicates an inversion state, the corrected core data is output as it is as the read data RD_DATA. Conversely, if the corrected second inversion flag CORRECTED_IF2 indicates a non-inversion state, the corrected core data is inverted to then be output as the read data RD_DATA.

To sum up, if inversion data is stored in a write operation, the inversion data is inverted back to then be output in a read operation. If non-inversion data is stored in a write operation, the non-inversion data is output as it is in a read operation.

Figure 28:
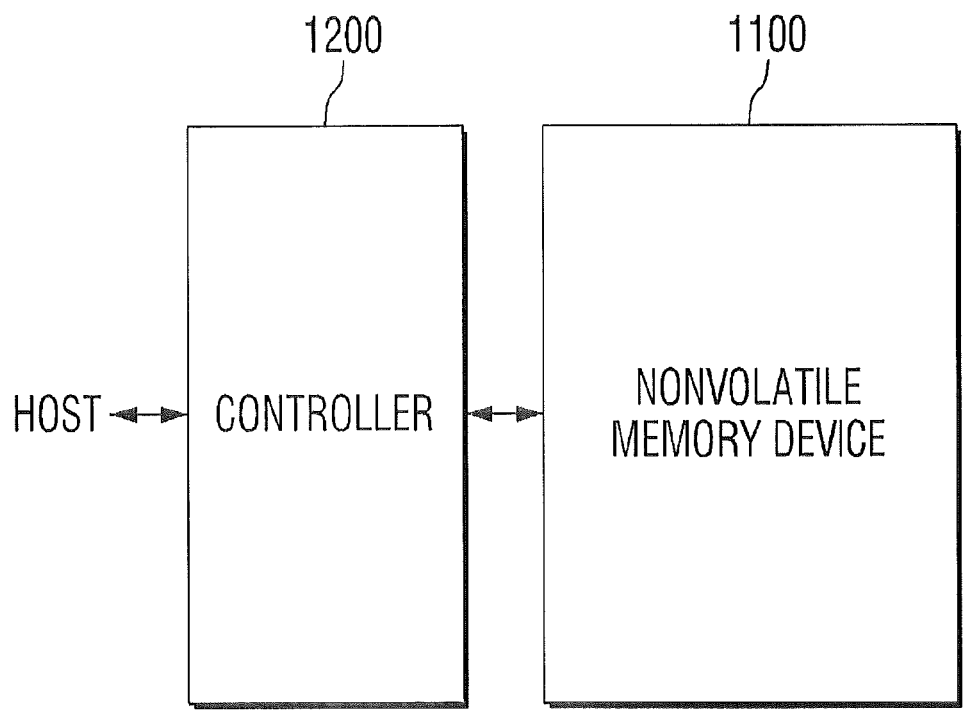
FIG. 28 is a block diagram of a memory system according to still other embodiments of present Inventive concepts.

FIG. 28 is a block diagram of a memory system according to some embodiments of present Inventive concepts.

Referring to FIG. 28, the memory system 1000 may include a nonvolatile memory device 1100 and a controller 1200.

The nonvolatile memory device 1100 may be configured and may operate in the same manner as described above with reference to FIGS. 1 to 27.

The controller 1200 is connected to a host and a nonvolatile memory device 1100. The controller 1200 may be configured to access the nonvolatile memory device 1100 in response to a request from the host. For example, the controller 1200 may be configured to control read, write, erase, and background operations of the nonvolatile memory device 1100. The controller 1200 is configured to provide interfacing between the nonvolatile memory device 1100 and the host. The controller 1200 is configured to drive firmware to control the nonvolatile memory device 1100.

As an example, the controller 1200 may further include well known components, including a Random Access Memory (RAM), a processing unit, a host interface, a memory interface, and so on. The RAM is used as at least one of an operating memory of the processing unit, a cache memory between the nonvolatile memory device 1100 and the host, and a buffer memory between the nonvolatile memory device 1100 and the host. The processing unit controls the overall operation of the controller 1200.

The host interface includes a protocol to perform data exchange between the host and the controller 1200. As an example, the controller 1200 may be configured to communicate with an external device (host) through at least one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol.

The memory interface performs interfacing with the nonvolatile memory device 1100. For example, the memory interface may include a NAND interface or a NOR interface.

The memory system 1000 may additionally include an error correction block. The error correction block may be configured to detect an error of data read from the nonvolatile memory device 1100 using ECC and correct the detected error. As an example, the error correction block may be provided as a component of the controller 1200. Alternatively, the error correction block may be provided as a component of the nonvolatile memory device 1100.

The controller 1200 and the nonvolatile memory device 1100 may be integrated into a single semiconductor device and form a memory card, such as a PC card (Personal Computer Memory Card International Association (PCMCIA) card), a compact flash (CF) card, a smart media card (SM, SMC), a memory stick, a multimedia card (MMC, RS-MMC, MMCmicro), an SD card (SD, miniSD, microSD, SDHC), a universal flash storage (UFS), or the like.

The controller 1200 and the nonvolatile memory device 1100 may be integrated into a semiconductor device and form a solid state drive (SSD). The semiconductor drive (SSD) includes a storage device configured to store data in a semiconductor memory. When the memory system 1000 is used as the SSD, the operating speed of a host connected to the memory system 1000 is remarkably improved.

As another example, the memory system 1000 may be an ultra mobile personal computer (UMPC), a workstation, a net-book, a personal digital assistance (PDA), a personal computer (PC), a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a wireless communication device, one of various electronic devices constituting a home network, one of various electronic devices constituting a computer network, one of various electronic devices constituting a telematics network, a radio frequency identification (RFID) device, or the like.

As another example, the nonvolatile memory device 1100 or the memory system 1000 may be mounted using various kinds of packages. For instance, the nonvolatile memory device 1100 or the memory system 1000 may be mounted in packages, such as a Package on Package (PoP), Ball Grid Array (BGA), Chip Scale Package (CSP), Plastic Leaded Chip Carrier (PLCC), Plastic Dual In-line Package (PDIP), Die-in-Waffle Pack, Die-in-Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 29:
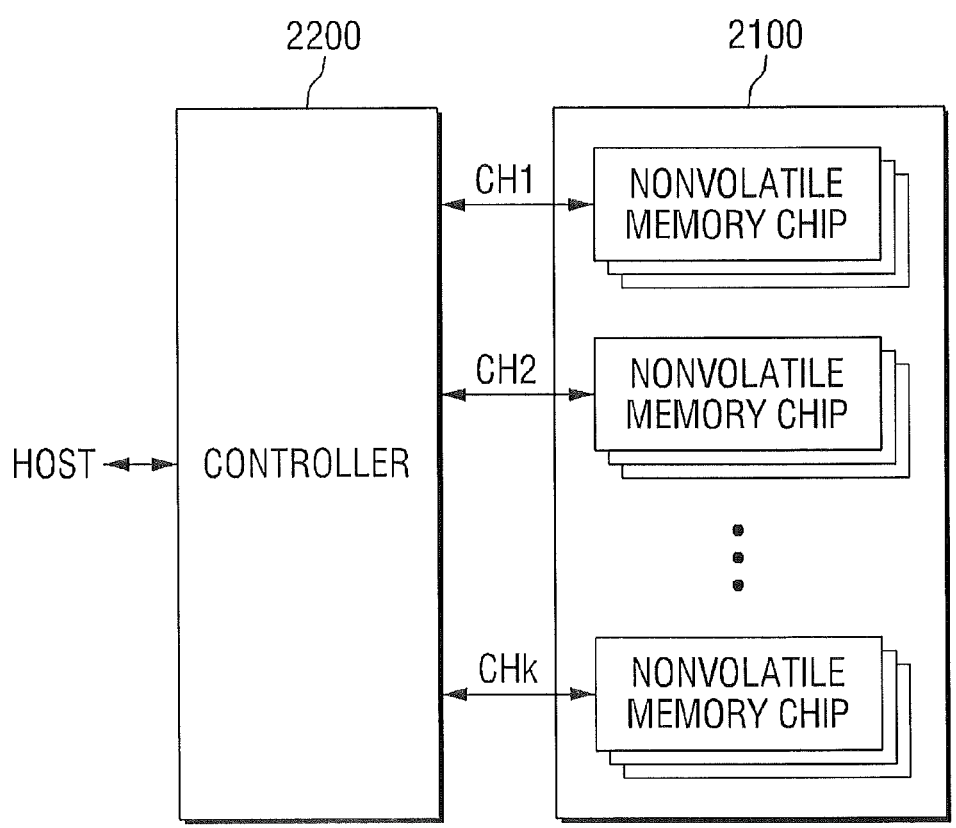
FIG. 29 is a block diagram illustrating an example of an application of the memory system shown in FIG. 28.

FIG. 29 is a block diagram illustrating an application example of the memory system shown in FIG. 28.

Referring to FIG. 29, the memory system 2000 includes a nonvolatile memory device 2100 and a controller 2200. The nonvolatile memory device 2100 includes a plurality of nonvolatile memory chips. The plurality of nonvolatile memory chips are divided into a plurality of groups. Each group of the plurality of nonvolatile memory chips are configured to communicate with the controller 2200 through a common channel. In the illustrated embodiment, the plurality of nonvolatile memory chips communicate with the controller 2200 through first to kth channels CH1~CHk.

Each of the nonvolatile memory chips has the same configuration as the nonvolatile memory device 100 shown in FIGS. 1 to 27.

In FIG. 29, a plurality of nonvolatile memory chips are connected to a single channel, but aspects of present Inventive concepts are not limited thereto. Alternatively, the memory system 2000 may be modified such that a single nonvolatile memory chip may be connected to a single channel.

Figure 30:
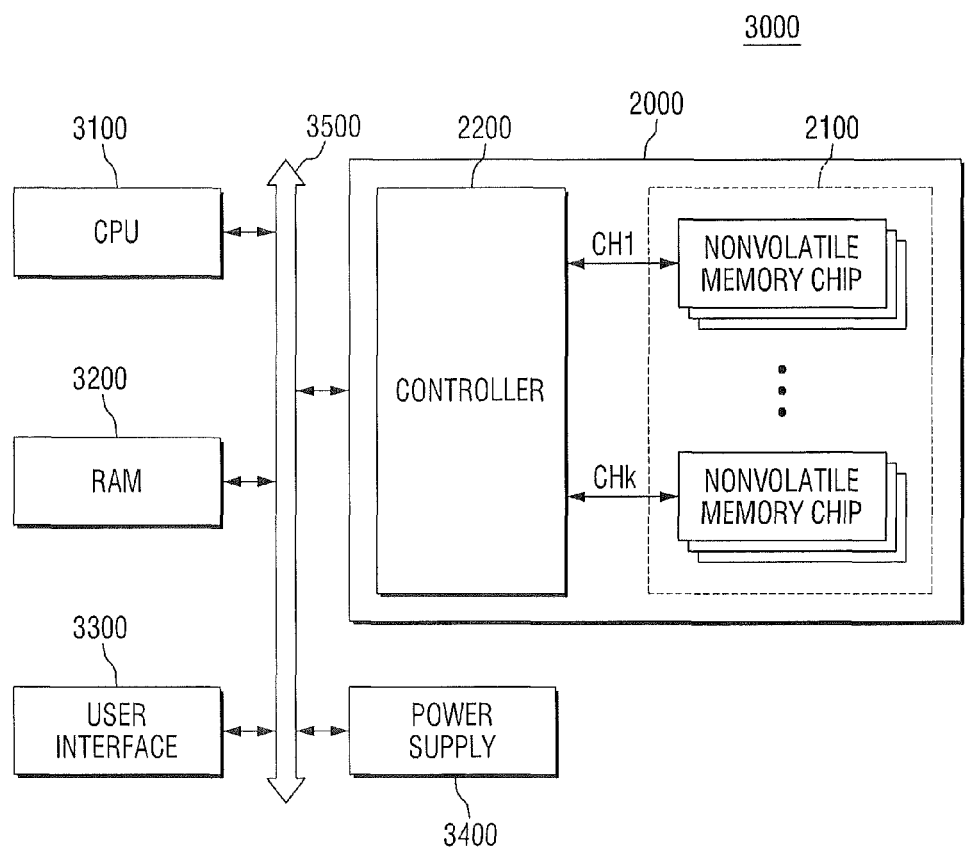
FIG. 30 is a block diagram of a computing system including the memory system shown in FIG. 29.

FIG. 30 is a block diagram of a computing system including the memory system shown in FIG. 29.

Referring to FIG. 30, a computing system 3000 includes a CPU 3100, RAM 3200, a user interface 3300, a power supply 3400, and a memory system 2000.

The memory system 2000 is electrically connected to the CPU 3100, the RAM 3200, the user interface 3300 and the power supply 3400 through the system bus 3500. The data supplied from the user interface 3300 or processed by the CPU 3100 is stored in the memory system 2000.

In FIG. 30, the nonvolatile memory device 2100 is connected to the system bus 3500 through the controller 2200, but aspects of present Inventive concepts are not limited thereto. Alternatively, the nonvolatile memory device 2100 may be configured to be directly connected to the system bus 3500.

While FIG. 30 shows that the memory system 2000 shown in FIG. 29 is provided, the memory system 2000 may be replaced by the memory system 1000 shown in FIG. 28.

As an example, the computing system 3000 may be configured to include both the memory systems 1000 and 2000 shown in FIGS. 28 and 29.

While present Inventive concepts have been particularly shown and described with reference to examples of embodiments thereof, it will be understood by those of ordinary skill in the art that various changes in form and details may be made therein without departing from the spirit and scope of present Inventive concepts as defined by the following claims. It is therefore desired that the present embodiments be considered in all respects as illustrative and not restrictive, reference being made to the appended claims rather than the foregoing description to indicate the scope of inventive concepts.

What is claimed is:

1. A memory device comprising:
a memory core including a plurality of memory cells;
a first read circuit that is configured to read a first codeword from the memory core during a Read While Write (RWW) operation;
a second read circuit that is configured to read a second codeword from the memory core during a Read Modification Write (RMW) operation; and
a common decoder that is shared by the first read circuit and the second read circuit and that is configured to selectively decode the first codeword or the second codeword.

2. The memory device of claim 1, further comprising:
a signal generator that is configured to generate a selection signal to determine whether the common decoder decodes the first codeword or the second codeword, wherein the common decoder is configured to selectively decode the first codeword or the second codeword responsive to the selection signal.

3. The memory device of claim 2, wherein the signal generator is further configured to generate a protection signal enabled during at least a portion of the RWW operation, and wherein the signal generator is configured to enable the selection signal responsive to the protection signal being enabled and responsive to the protection signal being disabled.

4. The memory device of claim 3, wherein the selection signal is enabled when the protection signal is disabled from the enabled state.

5. The memory device of claim 3, wherein the second read circuit is configured to block a RMW read operation when the protection signal is in an enabled state.

6. The memory device of claim 3, wherein the second read circuit is configured to perform the RMW read operation after the protection signal is disabled.

7. The memory device of claim 6, wherein the signal generator is configured to enable the selection signal when the protection signal is disabled from the enabled state.

8. The memory device of claim 1, wherein the first read circuit is configured to perform the RWW read operation first when the RMW read command is first input and the RWW read command is then input after the RMW read command before the second read circuit initiates the RWM read operation.

9. The memory device of claim 1, further comprising:
a selector that is configured to operate in response to a selection signal, wherein when the selection signal is at a first level, the selector is configured to couple the first read circuit to the common decoder, and when the selection signal is at a second level, the selector is configured to couple the second read circuit to the common decoder.

10. A memory device comprising:
a memory core including a plurality of memory cells;
a first read circuit that is configured to read a first codeword from the memory core during a Read While Write (RWW) operation;
a second read circuit that is configured to read a second codeword from the memory core during a Read Modification Write (RMW) operation;
a first decoder that is coupled to the first read circuit, wherein the first decoder is configured to decode the first codeword; and
a second decoder that is coupled to the second read circuit, wherein the second decoder is configured to decode the second codeword,
wherein the first decoder and the second decoder do not perform decoding operations simultaneously.

11. The memory device of claim 10, wherein the first decoder and the second decoder receive a selection signal from the signal generator, wherein the first decoder is configured to decode the first codeword responsive to the selection signal being at a first level, and wherein the second decoder is configured to decode the second codeword when the selection signal is at a second level.

12. The memory device of claim 11, wherein the signal generator is further configured to generate a protection signal that is enabled during at least a portion of the RWW operation, and wherein the signal generator is configured to enable the selection signal responsive to the protection signal being enabled and responsive to the protection signal being disabled.

13. The memory device of claim 12, wherein the second read circuit is configured to block an RMW read operation when the protection signal is in an enabled state.

14. The memory device of claim 12, wherein the second read circuit is configured to perform the RMW read operation after the protection signal is disabled.

15. The memory device of claim 10, wherein the first read circuit is configured to perform the first RWW read operation first when the RMW read command is first input and the RWW read command is then input after the RMW read command before the second read circuit initiates the RWM read operation.

16. A memory device comprising:
a memory core including a plurality of memory cells;
a first read circuit that is configured to read a first codeword from the memory core;
a second read circuit that is configured to read a second codeword from the memory core; and
a common decoder that is shared by the first read circuit and the second read circuit and that is configured to selectively decode the first codeword or the second codeword.

17. The memory device of claim 16, further comprising:
a signal generator that is configured to generate a selection signal to determine whether the common decoder decodes the first codeword or the second codeword, wherein the common decoder is configured to selectively decode the first codeword or the second codeword responsive to the selection signal.

18. The memory device of claim 16, wherein the signal generator is further configured to generate a protection signal enabled during at least a portion of the first read operation, and wherein the signal generator is configured to enable the selection signal responsive to the protection signal being enabled and responsive to the protection signal being disabled.

19. The memory device of claim 18, wherein the selection signal is enabled when the protection signal is disabled from the enabled state.

20. The memory device of claim 16, further comprising:
a selector that is configured to operate in response to a selection signal, wherein when the selection signal is at a first level, the selector is configured to couple the first read circuit to the common decoder, and when the selection signal is at a second level, the selector is configured to couple the second read circuit to the common decoder.

* * * * *